(12) United States Patent
Kawasaki

(10) Patent No.: US 9,192,060 B2
(45) Date of Patent: Nov. 17, 2015

(54) ELECTRONIC DEVICE

(75) Inventor: Yasuhiko Kawasaki, Kanagawa (JP)

(73) Assignee: NEC CORPORATION, Tokyo (JP)

( * ) Notice: Subject to any disclaimer, the term of this patent is extended or adjusted under 35 U.S.C. 154(b) by 0 days.

(21) Appl. No.: 14/345,604

(22) PCT Filed: Jul. 19, 2012

(86) PCT No.: PCT/JP2012/004600
§ 371 (c)(1),
(2), (4) Date: Mar. 18, 2014

(87) PCT Pub. No.: WO2013/042296
PCT Pub. Date: Mar. 28, 2013

(65) Prior Publication Data
US 2014/0355216 A1    Dec. 4, 2014

(30) Foreign Application Priority Data

Sep. 21, 2011  (JP) ................................ 2011-205787
Sep. 21, 2011  (JP) ................................ 2011-205788

(51) Int. Cl.
*H04M 1/00*  (2006.01)
*H05K 5/00*  (2006.01)

(52) U.S. Cl.
CPC ....................................... *H05K 5/00* (2013.01)

(58) Field of Classification Search
CPC ............ H04M 1/0214; H04M 1/0212; H04M 1/0227; H04M 1/0233; H04M 1/0247; H04M 2250/16; H04M 1/0216; H04M 1/0218; H04M 1/0225; H04M 1/0243; G06F 1/1616; G06F 1/1681; G06F 1/1622; G06F 1/1613

USPC .......................................................... 455/575.3
See application file for complete search history.

(56) References Cited

U.S. PATENT DOCUMENTS 5,987,704 A *  11/1999  Tang ................................ 16/354
6,519,812 B2 *  2/2003  Ko et al. .......................... 16/354
(Continued)

FOREIGN PATENT DOCUMENTS

JP     2005-155750      6/2005
JP     2009-141750      6/2009
(Continued)

OTHER PUBLICATIONS

International Search Report corresponding to PCT/JP2012/004600, dated Aug. 14, 2012; 1 page.

*Primary Examiner* — Kwasi Karikari
(74) *Attorney, Agent, or Firm* — Wilmer Cutler Pickering Hale and Dorr LLP

(57) ABSTRACT

The electronic device includes a first casing, a second casing, and a connecting member engaging with the first casing to allow the first casing to turn about a first axis of rotation, and engaging with the second casing to allow the second casing to turn about a second axis of rotation. When a turning angle is 0 or 360 degrees, a distance between the first and second axes of rotation equals to the sum of a half of the sum of the thicknesses of the first and second casings and a clearance between the first and second casings, and the first axis of rotation is arranged at a position shifted from the center of the first casing in a reference direction to the second casing side, by a half of a value calculated by subtracting the thickness of the first casing from the thickness of a first casing-side connecting portion.

11 Claims, 35 Drawing Sheets

(56) References Cited

U.S. PATENT DOCUMENTS

| | | | |
|---|---|---|---|
| 6,785,566 B1 * | 8/2004 | Irizarry | 455/575.8 |
| 7,483,723 B2 * | 1/2009 | Soderlund | 455/575.1 |
| 2005/0239520 A1 * | 10/2005 | Stefansen | 455/575.1 |
| 2006/0264243 A1 * | 11/2006 | Aarras | 455/566 |
| 2009/0149226 A1 | 6/2009 | Watanabe | |

FOREIGN PATENT DOCUMENTS

| | | |
|---|---|---|
| JP | 2009-222079 | 10/2009 |
| JP | 2011-099531 | 5/2011 |

* cited by examiner

ELECTRONIC DEVICE

CROSS-REFERENCE TO RELATED APPLICATIONS

This application is a national stage application of International Application No. PCT/JP2012/004600, entitled "Electronic Apparatus," filed on Jul. 19, 2012, which claims the benefit of the priority of Japanese Patent Application No. 2011-205787, filed on Sep. 21, 2011, and Japanese Patent Application No. 2011-205788, filed on Sep. 21, 2011, the disclosures of each of which are hereby incorporated by reference in their entirety.

TECHNICAL FIELD

The present invention relates to an electronic device in which a first casing and a second casing are configured to be able to turn.

BACKGROUND ART

Electronic devices in which a first casing and a second casing are configured to be able to turn have been known. As one of this type of electronic devices, Patent Document 1 discloses an electronic device 90. As shown in FIG. 1, the electronic device 90 includes a first casing 91 in a flat plate shape having a substantially uniform thickness and including a front surface and a rear surface parallel to the front surface, a second casing 92 in a flat plate shape having a substantially uniform thickness and including a front surface and a rear surface parallel to the front surface, and a connecting member 93 connecting the first casing 91 and the second casing 92.

The connecting member 93 engages with the first casing 91 in such a manner as to allow the first casing 91 to turn about a first axis of rotation A91 passing through first casing-side connecting portions 91a formed at one end of the first casing 91. Further, the connecting member 93 engages with the second casing 92 in such a manner as to allow the second casing 92 to turn about a second axis of rotation A92, parallel to the first axis of rotation A91, passing through second casing-side connecting portions 92a formed at one end of the second casing 92.

Thereby, the electronic device 90 is configured such that the turning angle, which is an angle formed between the first casing 91 and the second casing 92, is changeable between 0 degree (a state shown in FIG. 2) and 360 degrees (a state shown in FIG. 3).

Patent Document 1: JP 2005-155750 A

SUMMARY

In the electronic device 90, in a state where the turning angle is 0 degree, the first axis of rotation is positioned at a center C91 in a reference direction D90 of the first casing, as shown in FIG. 2. Here, the reference direction D90 is a direction orthogonal to the front surface of the first casing 91.

Meanwhile, as shown in FIG. 4, in a state where the turning angle is 0 degree, the electronic device 90 may be configured such that the thickness T91 of the first casing 91 is smaller than the thickness T91a in the reference direction D90 of the first casing-side connecting portions 91a.

In that case, in the electronic device 90, the first casing-side connecting portions 91a protrude from a plane P91 formed by the part other than the first casing-side connecting portions 91a of the first casing 91, in a state where the turning angle is 0 degree as shown in FIG. 4 or a state where the turning angle is 360 degrees as shown in FIG. 5.

Accordingly, a first object of the present invention is to provide an electronic device capable of solving the above-described problem, that is, a problem that "the first casing-side connecting portions protrude from the plane formed by the part other than the first casing-side connecting portions of the first casing".

Further, the electronic device 90 is configured such that the first casing 91 and the second casing 92 turn in opposite directions by the same angle with respect to the connecting member 93. Accordingly, as shown in FIGS. 6 and 7, in a state where the turning angle is 180 degrees, the two axes of rotation (first axis of rotation A91 and second axis of rotation A92) are arranged so as to be aligned in a plane orthogonal to the reference direction D90 (that is, a plane parallel to the plane formed by the front surface of the first casing 91 and the front surface of the second casing 92). Here, the reference direction D90 is a direction orthogonal to the front surface of the first casing 91.

Accordingly, if a display for displaying information is disposed on each of the front surface of the first casing 91 and the front surface of the second casing 92, in a state where the turning angle is 180 degrees, there is a case where the clearance between the displays may be excessive.

As such, it would be preferable to configure the electronic device 90 in such a manner that when a state is changed from a state where the turning angle is 0 degree to a state where the turning angle is 180 degrees, the first casing 91 turns with respect to the connecting member 93 while the second casing 92 does not turn with respect to the connecting member 93.

In that case, as shown in FIGS. 8 and 9, in a state where the turning angle is 180 degrees, the two axes of rotation (first axis of rotation A91 and second axis of rotation 92A) are arranged so as to be aligned in a plane including the reference direction D90 (that is, a plane orthogonal to the plane formed by the front surface of the first casing 91, or a plane orthogonal to the plane formed by the front surface of the second casing 92). As such, if a display for displaying information is disposed on each of the front surface of the first casing 91 and the front surface of the second casing 92, in a state where the turning angle is 180 degrees, the clearance between the displays can be reduced as small as possible.

However, in the electronic device 90 configured as described above, in a state where the turning angle is 180 degrees, there is a problem that a difference in level is formed between the front surface of the first casing 91 and the front surface of the second casing 92.

Accordingly, a second object of the present invention is to provide an electronic device capable of solving the above-described problem, that is, a problem that "a difference in level is formed between the front surface of the first casing and the front surface of the second casing".

An electronic device, which is an aspect of the present invention for achieving the first object described above, is an electronic device including a first casing in a flat plate shape having a substantially uniform thickness, the first casing including a front surface and a rear surface parallel to the front surface;

a second casing in a flat plate shape having a substantially uniform thickness, the second casing including a front surface and a rear surface parallel to the front surface; and a connecting member that connects the first casing and the second casing, the connecting member engaging with the first casing in such a manner as to allow the first casing to turn about a first axis of rotation passing through first casing-side connecting portions formed at one end of the first casing, and engaging with the second casing in such a manner as to allow the second casing to turn about a second axis of rotation passing through second casing-side connecting portions formed at one end of the second casing, thereby allowing a turning angle which is an angle formed by the first casing and the second casing to be changeable between 0 degree and 360 degrees.

The electronic device is configured such that in a state where the turning angle is 0 degree or a state where the turning angle is 360 degrees, a distance between the first axis of rotation and the second axis of rotation in a reference direction, which is a direction orthogonal to the front surface of the first casing, equals to the sum calculated by adding a half of the sum of the thickness of the first casing and the thickness of the second casing, and a clearance between the first casing and the second casing in the reference direction, and that the first axis of rotation is arranged at a position shifted from the center of the first casing in the reference direction to a side of the second casing, by a half of a value calculated by subtracting the thickness of the first casing from the thickness of the first casing-side connecting portion in the reference direction.

An electronic device, which is an aspect of the present invention for achieving the second object described above, is an electronic device including a first casing in a flat plate shape having a substantially uniform thickness, the first casing including a front surface and a rear surface parallel to the front surface;

a second casing in a flat plate shape having a substantially uniform thickness, the second casing including a front surface and a rear surface parallel to the front surface; and a connecting member that connects the first casing and the second casing, the connecting member engaging with the first casing in such a manner as to allow the first casing to turn about a first axis of rotation passing through first casing-side connecting portions formed at one end of the first casing, and engaging with the second casing in such a manner as to allow the second casing to turn about a second axis of rotation passing through second casing-side connecting portions formed at one end of the second casing, thereby allowing a turning angle which is an angle formed by the first casing and the second casing to be changeable between 0 degree and 360 degrees.

The electronic device is configured such that in a state where the turning angle is 0 degree or a state where the turning angle is 360 degrees, the front surface of the first casing and the front surface of the second casing face each other, and that in a state where the turning angle is 180 degrees, the front surface of the first casing and the front surface of the second casing form the same plane.

As the present invention is configured as described above, it is possible to prevent the first casing-side connecting portions from protruding from the plane formed by the part other than the first casing-side connecting portions of the first casing.

Further, as the present invention is configured as described above, it is possible to prevent formation of a difference in level between the front surface of the first casing and the front surface of the second casing.

EXEMPLARY EMBODIMENTS

Figure 1:
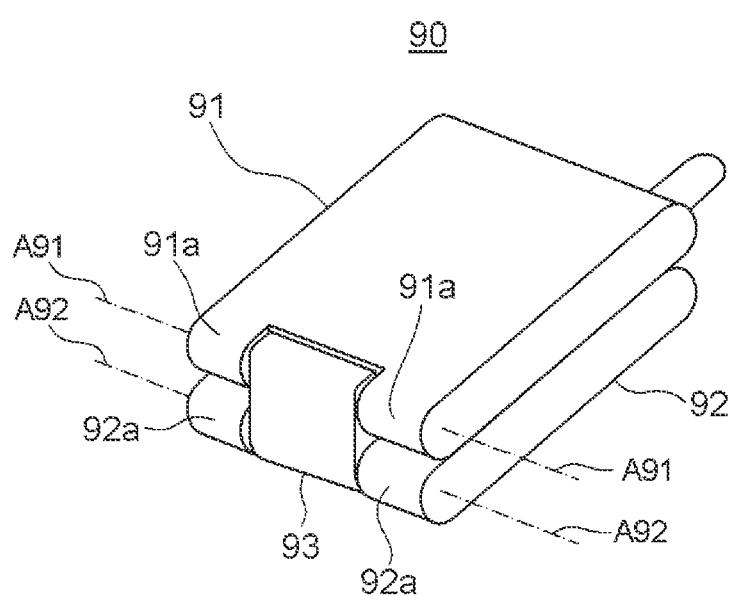
FIG. 1 is a diagram showing a schematic configuration of an electronic device according to background art.
Figure 2:
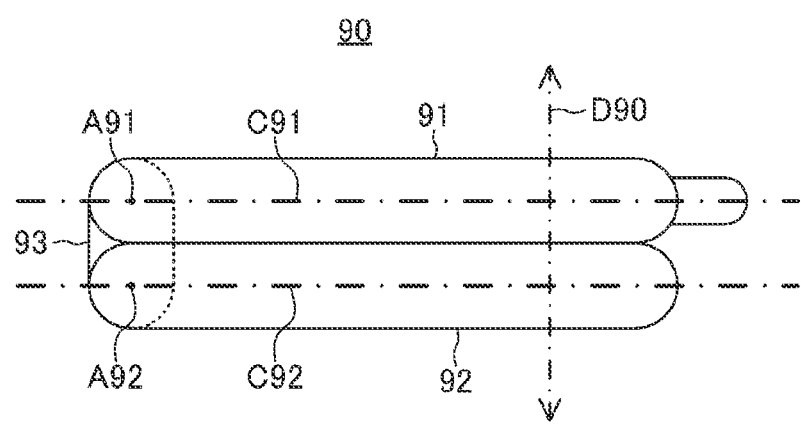
FIG. 2 is a side view of the electronic device according to the background art in a state where the turning angle is 0 degree.
Figure 3:
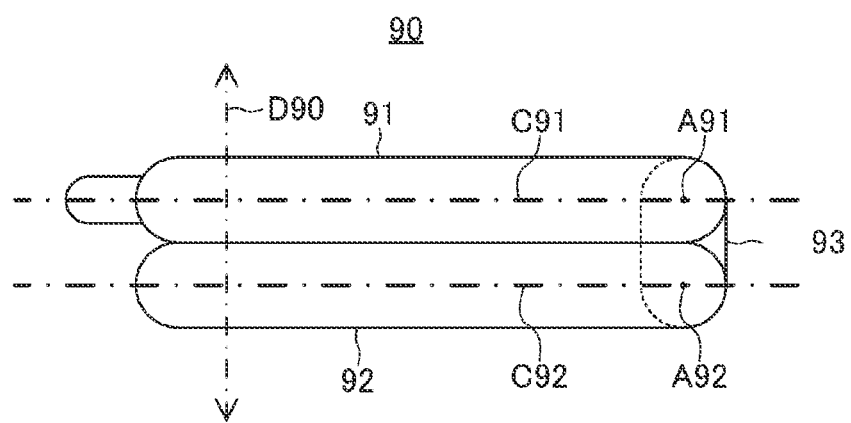
FIG. 3 is a side view of the electronic device according to the background art in a state where the turning angle is 360 degrees.
Figure 4:
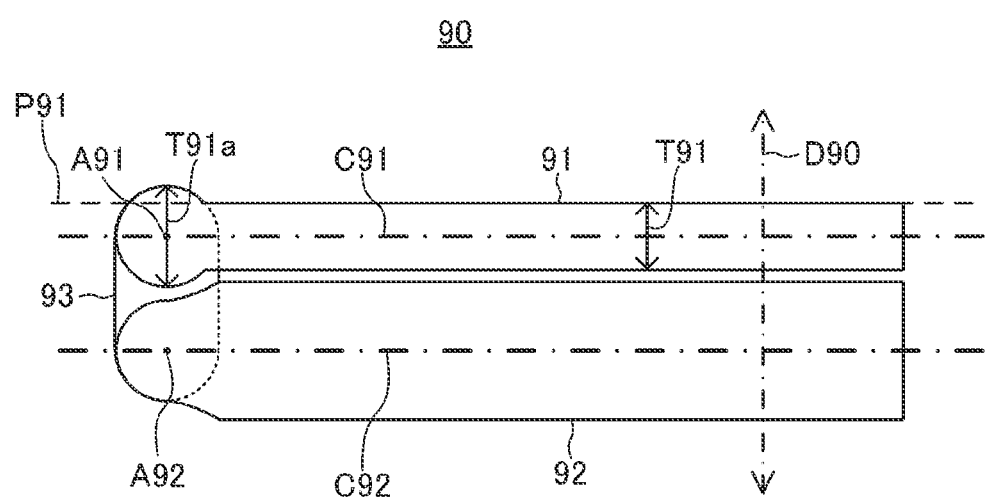
FIG. 4 is a side view of an electronic device according to the background art in a state where the turning angle is 0 degree.
Figure 5:
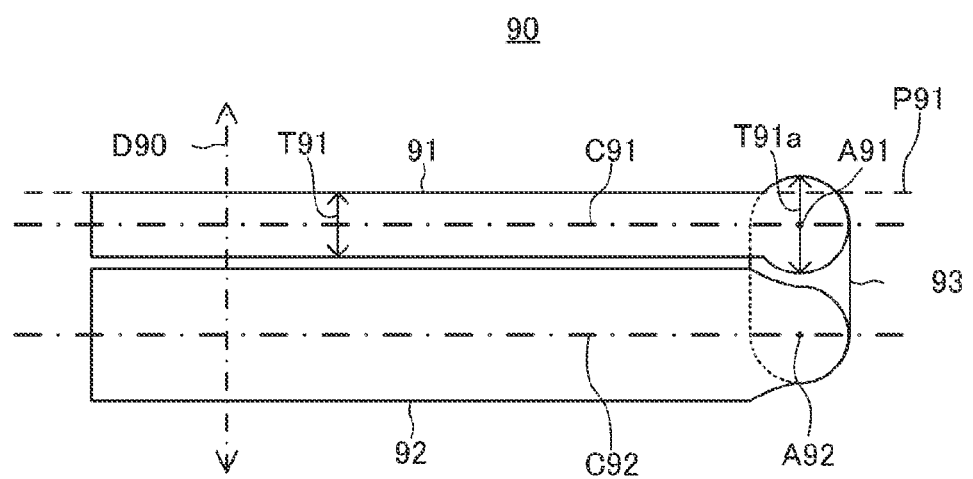
FIG. 5 is a side view of the electronic device according to the background art in a state where the turning angle is 360 degrees.
Figure 6:
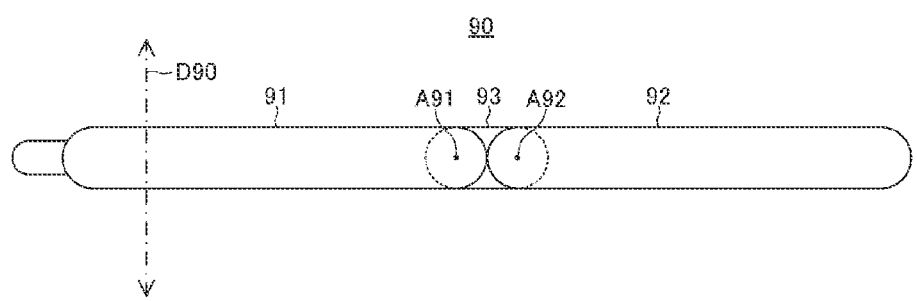
FIG. 6 is a side view of the electronic device according to the background art in a state where the turning angle is 180 degrees.
Figure 7:
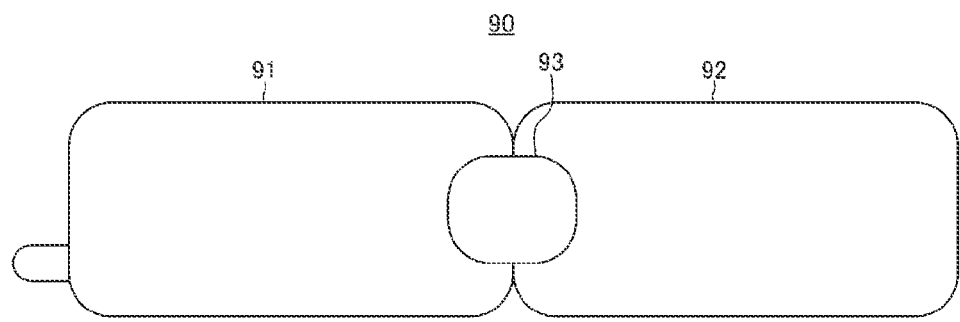
FIG. 7 is a front view of the electronic device according to the background art in a state where the turning angle is 180 degrees.
Figure 8:
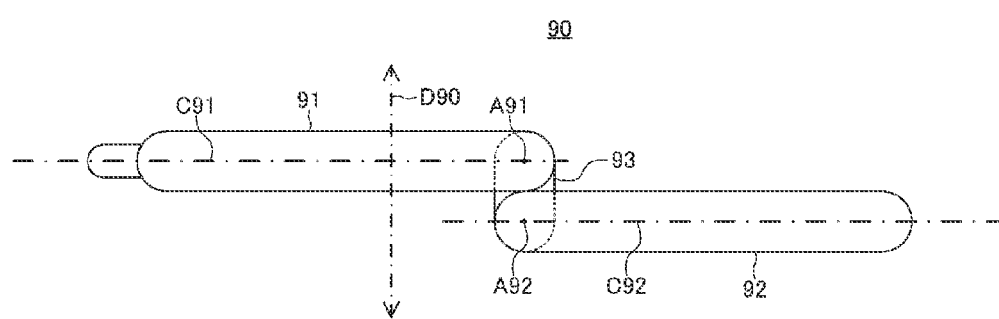
FIG. 8 is a side view of an electronic device in a state where the turning angle is 180 degrees.
Figure 9:
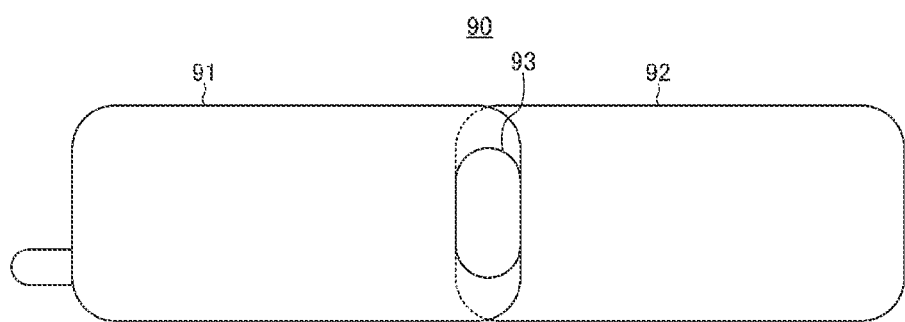
FIG. 9 is a front view of the electronic device in a state where the turning angle is 180 degrees.

Hereinafter, exemplary embodiments of electronic devices according to the present invention will be described with reference to FIGS. 10 to 35.

First Exemplary Embodiment

Configuration

As shown in FIGS. 10 to 16, an electronic device 10 according to a first exemplary embodiment is a folding mobile telephone terminal. It should be noted that the electronic device 10 may be a smart phone, a PHS (Personal Handy phone System), a PDS (Personal Data Assistance, Personal Digital Assistant), a car navigation terminal, a laptop PC, a game console, or the like.

The electronic device 10 includes a first casing 11, a second casing 12, and two hinge folders 13a and 13b. The electronic device 10 may include only one hinge folder, or three or more hinge folders.

The first casing 11 is a flat plate-like member in a rectangle shape having short sides and long sides in a front view, and has a substantially uniform thickness. The first casing 11 has a space formed therein. The first casing 11 is configured of two connecting portions 11a and 11b, and a flat plate portion 11c.

The two connecting portions 11a and 11b are arranged at one end in a short side direction. Each of the two connecting portions 11a and 11b is arranged at either end in a long side direction. It should be noted that a first axis of rotation A11 is arranged parallel to the long side direction, as described below. Accordingly, it can also be said that the two connecting portions 11a and 11b are formed at both ends in a direction along the first axis of rotation A11 of the first casing 11, respectively.

The flat plate portion 11c is a part other than the two connecting portions 11a and 11b of the first casing 11. The flat plate portion 11c includes a front surface 11s1 which is one outer wall surface in a thickness direction, and a rear surface 11s2 which is the other outer wall surface in the thickness direction (that is, parallel to the front surface 11s1).

The second casing 12 is a flat plate-like member in a rectangle shape having short sides and long sides in a front view, and has a substantially uniform thickness. The thickness of the second casing 12 is larger than the thickness of the first casing. The second casing 12 has a space formed therein. The second casing 12 is configured of two connecting portions 12a and 12b, and a flat plate portion 12c.

The two connecting portions 12a and 12b are arranged at one end in a short side direction. Each of the two connecting portions 12a and 12b is arranged at either end in a long side direction. It should be noted that a second axis of rotation A12 is arranged parallel to the long side direction, as described below. Accordingly, it can also be said that the two connecting portions 12a and 12b are formed at both ends in a direction along the second axis of rotation A12 of the second casing 12, respectively.

The flat plate portion 12c is a part other than the two connecting portions 12a and 12b of the second casing 12. The flat plate portion 12c includes a front surface 12s1 which is one outer wall surface in a thickness direction, and a rear surface 12s2 which is the other outer wall surface in the thickness direction (that is, parallel to the front surface 12s1).

Figure 10:
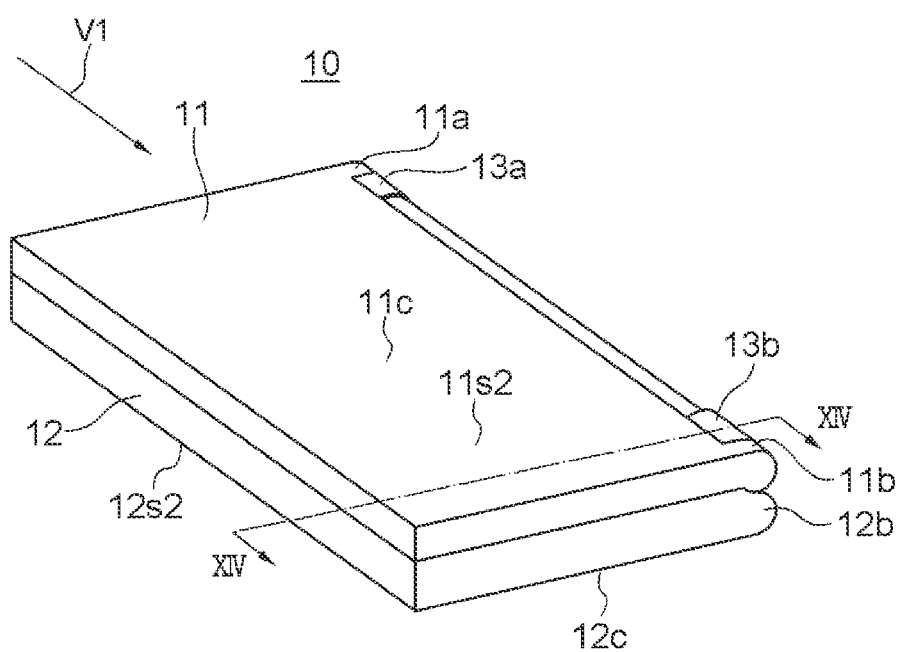
FIG. 10 is a perspective view of an electronic device according to a first exemplary embodiment of the present invention in a state where the turning angle is 0 degree.
Figure 11:
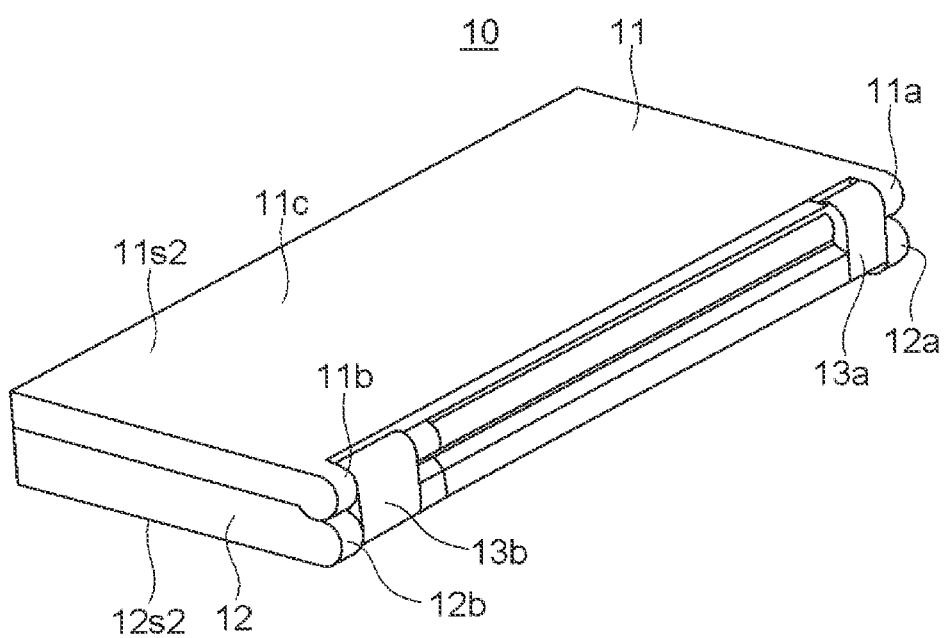
FIG. 11 is a perspective view of the electronic device according to the first exemplary embodiment of the present invention in a state where the turning angle is 0 degree.
Figure 12:
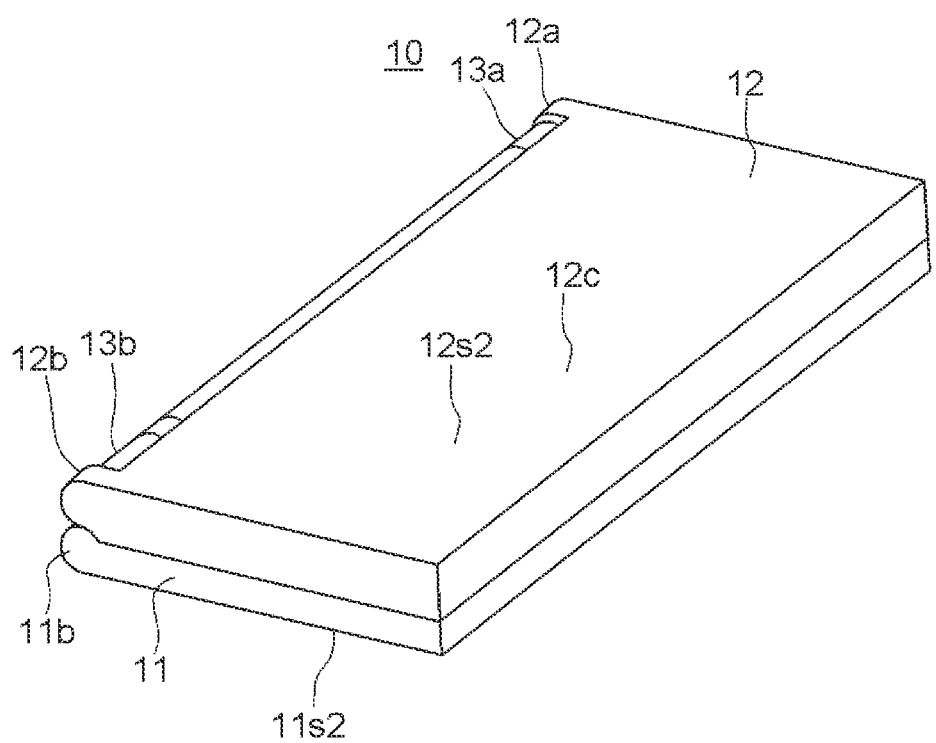
FIG. 12 is a perspective view of the electronic device according to the first exemplary embodiment of the present invention in a state where the turning angle is 0 degree.
Figure 17:
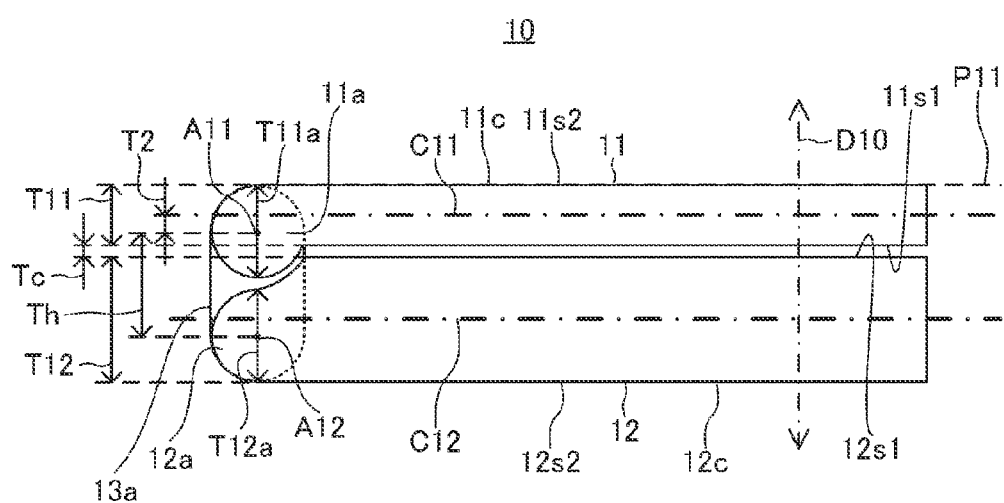
FIG. 17 is a side view of the electronic device seen toward a direction shown by an arrow V1 of FIG. 10.

The hinge folder 13a engages with the first casing 11 in such a manner as to allow the first casing 11 to turn about the first axis of rotation A11, as shown in FIG. 17 which is a side view when the electronic device 10 is viewed toward a direction shown by an arrow V1 of FIG. 10. In this example, the hinge folder 13a engages with the first casing 11 via a shaft, not shown, in such a manner as to allow the first casing 11 to turn.

Similarly, the hinge folder 13b engages with the first casing 11 in such a manner as to allow the first casing 11 to turn about the first axis of rotation A11, as in the case with the hinge folder 13a. The first axis of rotation A11 is disposed so as to pass through the connecting portions 11a and 11b. In this example, the hinge folder 13b engages with the first casing 11 via a shaft, not shown, in such a manner as to allow the first casing 11 to turn.

The first casing 11 is configured to be able to turn 180 degrees with respect to the two hinge folders 13a and 13b.

Figure 18:
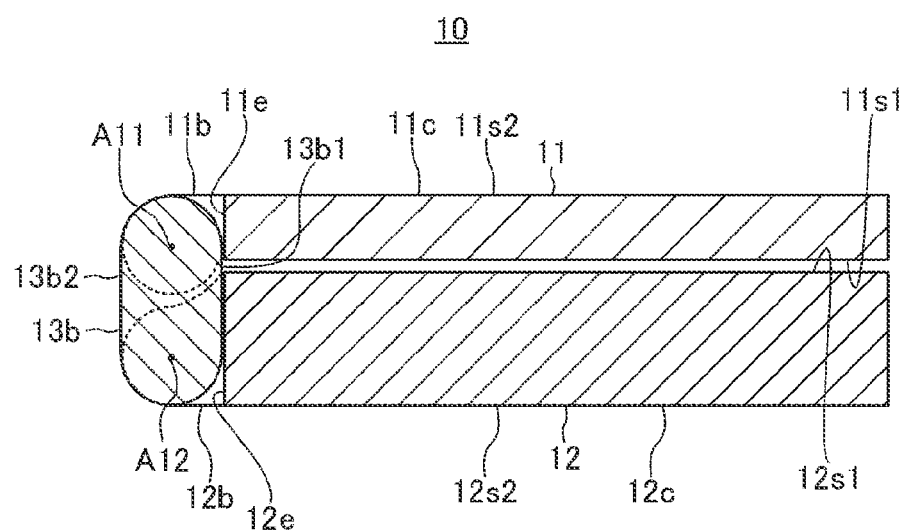
FIG. 18 is a cross-sectional view of the electronic device taken along the line XIV-XIV of FIG. 10.

Specifically, as shown in FIG. 18 which is a cross-sectional view of the electronic device 10 taken along the line XIV-XIV of FIG. 10, a side wall surface 13b1 on the right side, in FIG. 18, of the hinge folder 13b and a side wall surface 11e on the left side, in FIG. 18, of the first casing 11 (side wall surface on the hinge folder 13b side of the flat plate portion 11c) contact each other, whereby the first casing 11 is prevented from being turned in a clockwise direction in FIG. 18 with respect to the hinge folder 13b.

Figure 19:
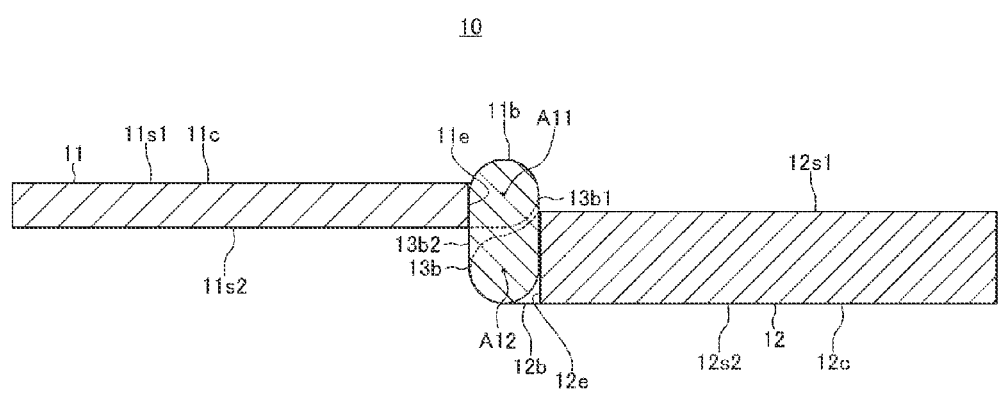
FIG. 19 is a diagram showing the electronic device in which the first casing of FIG. 18 is turned 180 degrees in a counterclockwise direction with respect to hinge folders.

FIG. 19 shows the electronic device 10 in the case where the first casing 11 in FIG. 18 is turned 180 degrees in a counterclockwise direction with respect to the hinge folder 13b. As shown in FIG. 19, in this state, a side wall surface 13b2 on the left side, in FIG. 19, of the hinge folder 13b and a side wall surface 11e on the right side, in FIG. 19, of the first casing 11 (side wall surface on the hinge folder 13b side of the flat plate portion 11c) contact each other, whereby the first casing 11 is prevented from being turned in a counterclockwise direction in FIG. 19 with respect to the hinge folder 13b.

It should be noted that the hinge folder 13a also regulates a turn of the first casing 11, as is the case with the hinge folder 13b.

In this way, the first casing 11 is configured to be able to turn 180 degrees with respect to the two hinge folders 13a and 13b.

Further, as shown in FIG. 17, the hinge folder 13a engages with the second casing 12 in such a manner as to allow the second casing 12 to turn about the second axis of rotation A12. In this example, the hinge folder 13a engages with the second casing 12 via a shaft, not shown, in such a manner as to allow the second casing 12 to turn.

Similarly, the hinge folder 13b engages with the second casing 12 in such a manner as to allow the second casing 12 to turn about the second axis of rotation A12, as in the case with the hinge folder 13a. In this example, the hinge folder 13b engages with the second casing 12 via a shaft, not shown, in such a manner as to allow the second casing 12 to turn.

The second axis of rotation A12 is disposed so as to pass through the connecting portions 12a and 12b. Further, the second axis of rotation A12 is arranged parallel to the first axis of rotation A11.

The second casing 12 is configured to be able to turn 180 degrees with respect to the two hinge folders 13a and 13b.

Specifically, as shown in FIG. 19, the side wall surface 13b1 on the right side, in FIG. 19, of the hinge folder 13b and a side wall surface 12e on the left side, in FIG. 19, of the second casing 12 (side wall surface on the hinge folder 13b side of the flat plate portion 12c) contact each other, whereby the second casing 12 is prevented from being turned in a counterclockwise direction in FIG. 19 with respect to the hinge folder 13b.

Figure 20:
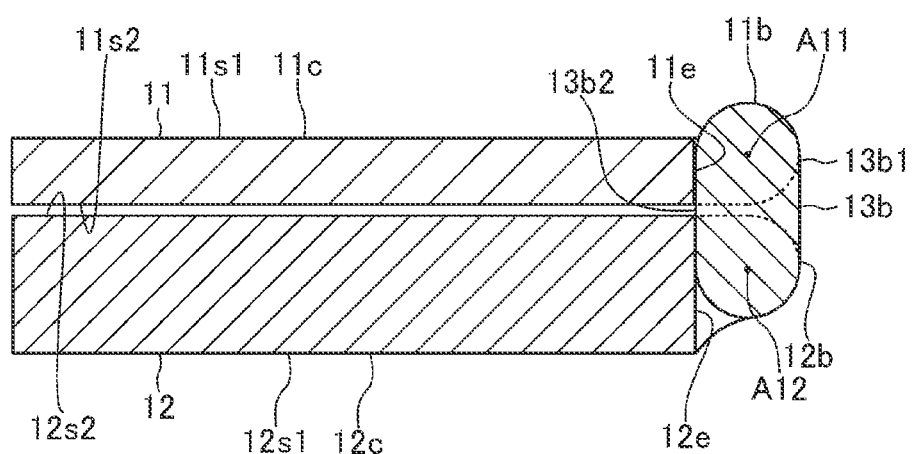
FIG. 20 is a diagram showing the electronic device in which the second casing of FIG. 19 is turned 180 degrees in a clockwise direction with respect to the hinge folders.

FIG. 20 shows the electronic device 10 in the case where the second casing 12 in FIG. 19 is turned 180 degrees in a clockwise direction with respect to the hinge folder 13b. As shown in FIG. 20, in this state, the side wall surface 13b2 on the left side, in FIG. 20, of the hinge folder 13b and a side wall surface 12e on the right side, in FIG. 20, of the second casing 12 (side wall surface on the hinge folder 13b side of the flat plate portion 12c) contact each other, whereby the second casing 12 is prevented from being turned in a clockwise direction in FIG. 20 with respect to the hinge folder 13b.

It should be noted that the hinge folder 13a also regulates a turn of the second casing 12, as in the case with the hinge folder 13b.

In this way, the second casing 12 is configured to be able to turn 180 degrees with respect to the two hinge folders 13a and 13b.

With this configuration, the first casing 11 and the second casing 12 turn independently of each other with respect to the two hinge folders 13a and 13b.

Further, with this configuration, the two hinge folders 13a and 13b connect the first casing 11 and the second casing 12 in such a manner that a turning angle formed by the first casing 11 and the second casing 12 is changeable between 0 degree and 360 degrees. As such, the two hinge folders 13a and 13b constitute connection members.

It can be said that the connecting portion 11a, the connecting portion 12a, and the hinge folder 13a constitute a parallel biaxial hinge. Similarly, it can be said that the connecting portion 11b, the connecting portion 12b, and the hinge folder 13b also constitute a parallel biaxial hinge.

Here, a turning angle will be described in more detail. In this example, a state where the turning angle is 0 degree is a state in which the front surface 11s1 of the first casing 11 and the front surface 12s1 of the second casing 12 face each other, and the front surface 11s1 of the first casing 11 and the front surface 12s1 of the second casing 12 are in parallel. As such, FIGS. 10 to 12, 17, and 18 show a state where the turning angle is 0 degree.

Further, a state where the turning angle is 360 degrees is a state in which the rear surface 11s2 of the first casing 11 and the rear surface 12s2 of the second casing 12 face each other, and the rear surface 11s2 of the first casing 11 and the rear surface 12s2 of the second casing 12 are in parallel. As such, FIGS. 14 to 16 and 20 show a state where the turning angle is 360 degrees.

Figure 13:
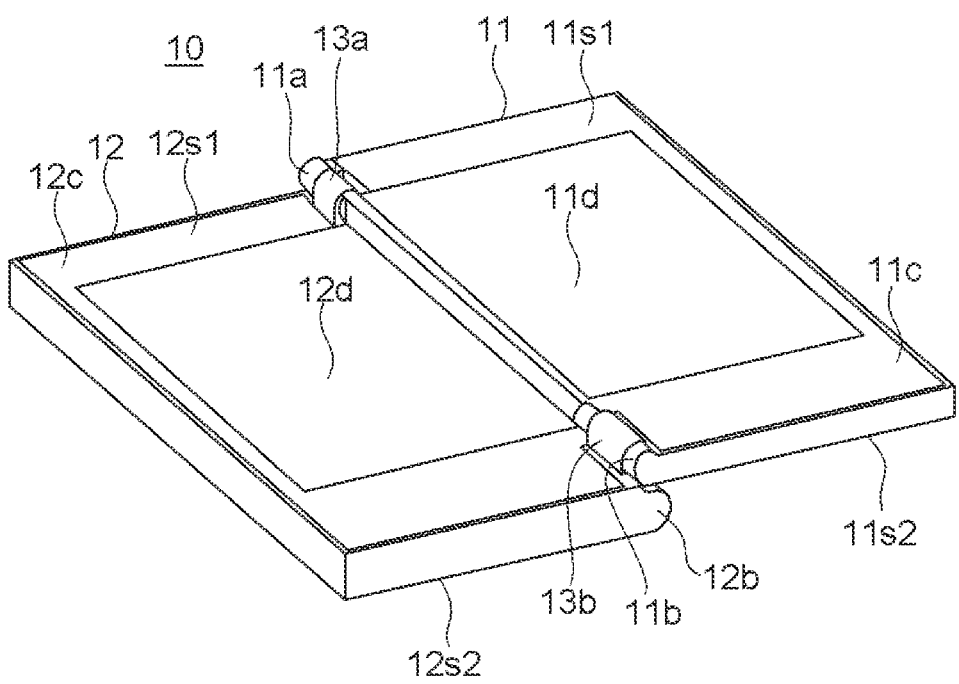
FIG. 13 is a perspective view of the electronic device according to the first exemplary embodiment of the present invention in a state where the turning angle is 180 degrees.
Figure 14:
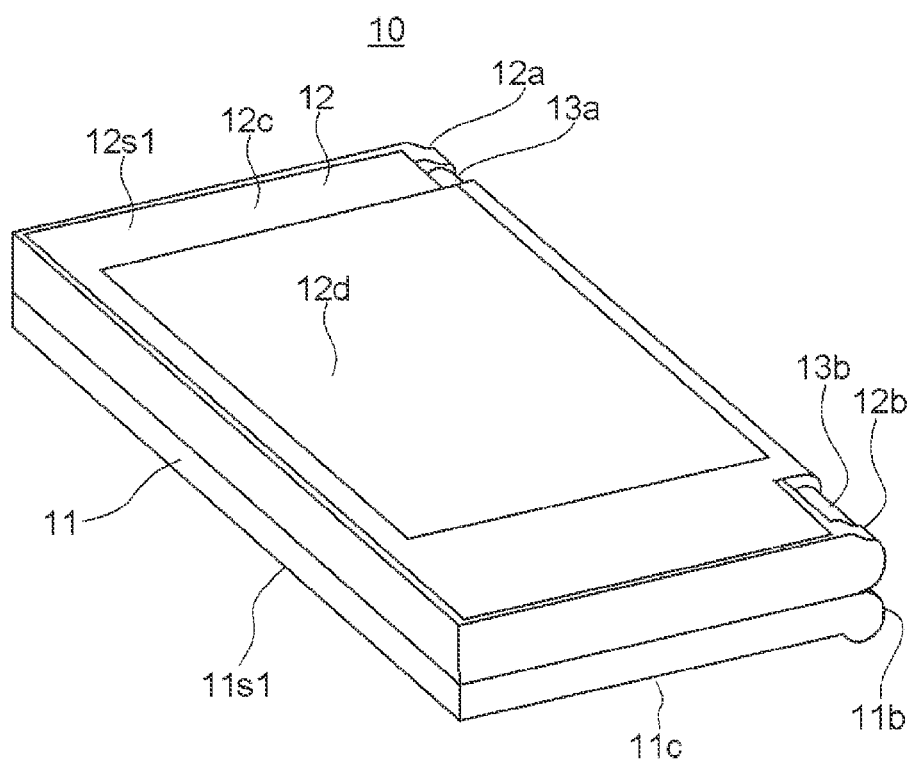
FIG. 14 is a perspective view of the electronic device according to the first exemplary embodiment of the present invention in a state where the turning angle is 360 degrees.
Figure 15:
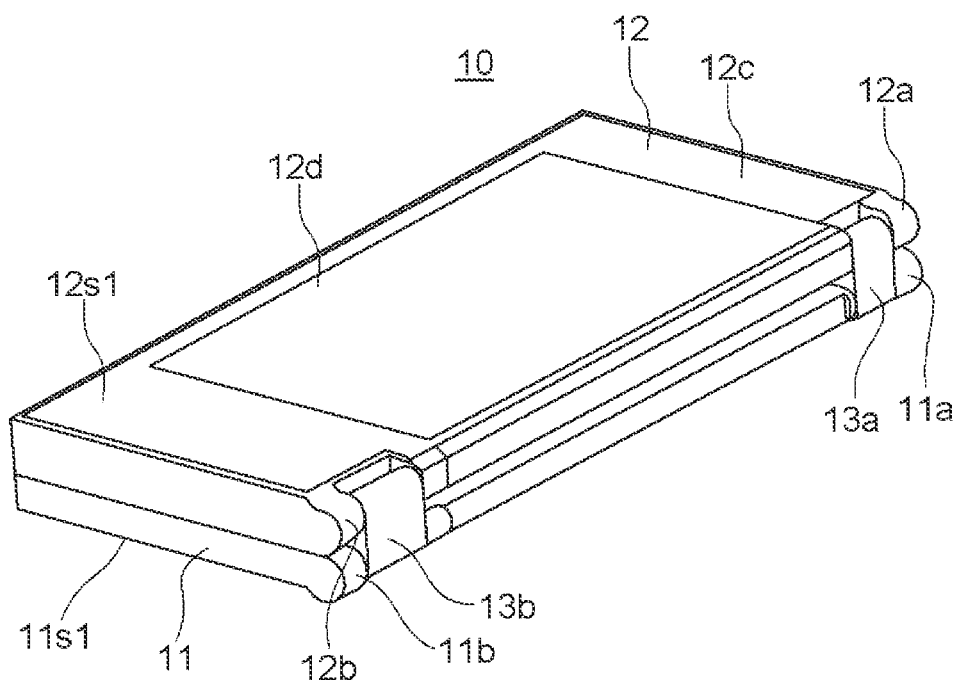
FIG. 15 is a perspective view of the electronic device according to the first exemplary embodiment of the present invention in a state where the turning angle is 360 degrees.
Figure 16:
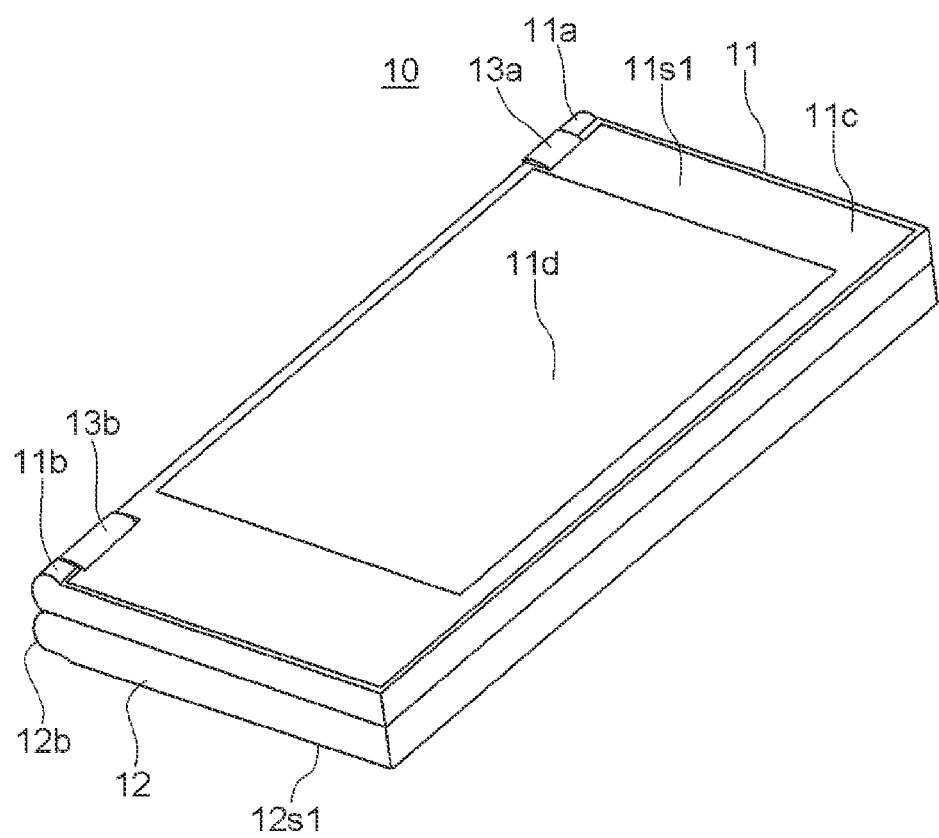
FIG. 16 is a perspective view of the electronic device according to the first exemplary embodiment of the present invention in a state where the turning angle is 360 degrees.

Further, a state where the turning angle is 180 degrees is a state in which the front surface 11s1 of the first casing 11 and the front surface 12s1 of the second casing 12 do not face each other, and the front surface 11s1 of the first casing 11 and the front surface 12s1 of the second casing 12 are in parallel. As such, FIGS. 13 and 19 show a state where the turning angle is 180 degrees.

Here, positions of the first axis of rotation A11 and the second axis of rotation A12 will be described in more detail.

As shown in FIG. 17, the first axis of rotation A11 is arranged parallel to the long side direction of the first casing 11. Similarly, the second axis of rotation A12 is arranged parallel to the long side direction of the second casing 12. Further, the first axis of rotation A11 is arranged parallel to the second axis of rotation A12.

Further, as shown in FIG. 17, in a state where the turning angle is 0 degree, the first axis of rotation A11 and the second axis of rotation A12 are arranged in a plane orthogonal to the short side direction of the first casing 11 (that is, on a line extending in a vertical direction in FIG. 17). It should be noted that in a state where the turning angle is 0 degree, the first axis of rotation A11 and the second axis of rotation A12 may be arranged at different positions in the short side direction of the first casing 11 (that is, a lateral direction in FIG. 17).

The electronic device 10 is configured such that in a state where the turning angle is 0 degree, a distance Th between the first axis of rotation A11 and the second axis of rotation A12 in a reference direction D10 equals to the sum T1+Tc calculated by adding a half T1 of the sum of the thickness T11 of the first casing 11 and the thickness T12 of the second casing 12, that is, T1=(T11+T12)/2, and a clearance Tc between the first casing 11 and the second casing 12 in the reference direction D10. Here, the reference direction D10 is a direction orthogonal to the front surface 11s1 of the first casing 11.

It should be noted that the electronic device 10 may be configured such that in a state where the turning angle is 360 degrees, the distance between the first axis of rotation A11 and the second axis of rotation A12 in the reference direction D10 equals to the sum calculated by adding a half of the sum of the thickness of the first casing 11 and the thickness of the second casing 12, and the clearance in the reference direction D10 between the first casing 11 and the second casing 12.

Further, the electronic device 10 is configured such that the first axis of rotation A11 is arranged at a position shifted from the center C11 of the first casing 11 in the reference direction D10 to the second casing side, by the amount of a half T2 of the value calculated by subtracting the thickness T11 of the first casing 11 from the thickness T11a of the connecting portion 11a, 11b in the reference direction D10 at a position passing through the first axis of rotation A11 (outer radial of the connecting portion 11a or 11b), that is, T2=(T11a−T11)/2.

In addition, the electronic device 10 is configured such that in a state where the turning angle is 0 degree, the sum T11a+T12a, calculated by adding the thickness T11a of the connecting portion 11a or 11b in the reference direction D10 at a position passing through the first axis of rotation A11 and the thickness T12a of the connecting portion 12a or 12b in the reference direction D10 at a position passing through the second axis of rotation A12 (outer radial of the connecting portion 12a or 12b), is smaller than the sum T11+T12+Td, calculated by adding the thickness T11 of the first casing 11, the thickness T12 of the second casing 12, and the clearance Tc between the first casing 11 and the second casing 12 in the reference direction D10.

It should be noted that the electronic device 10 may be configured such that in a state where the turning angle is 360 degrees, the sum of the thickness of the connecting portion 11a or 11b in the reference direction D10 at a position passing through the first axis of rotation A11 and the thickness of the connecting portion 12a or 12b in the reference direction D10 passing through the second axis of rotation A12, is smaller than the sum of the thickness of the first casing 11, the thickness of the second casing 12, and the clearance between the first casing 11 and the second casing 12 in the reference direction D10.

With this configuration, in a state where the turning angle is 0 degree or a state where the turning angle is 360 degrees, the electronic device 10 is able to form a predetermined clearance between the first casing 11 and the second casing 12. Further, in the electronic device 10, the turning angle can be changed between 0 degree and 360 degrees.

Further, according to the above-described configuration, even in the case where the thickness T11 of the first casing 11 is smaller than the thickness of the connecting portion 11a or 11b in the reference direction D10 at a position passing through the first axis of rotation A11, in a state where the turning angle is 0 degree, it is possible to prevent the connecting portions 11a and 11b from protruding from a plane P11 formed by the flat plate portion 11c of the first casing 11.

Further, the electronic device 10 is configured such that when a state is changed from a state where the turning angle is 0 degree to a state where the turning angle is 180 degrees, the first casing 11 turns with respect to the hinge folders 13a and 13b while the second casing 12 does not turn with respect to the hinge folders 13a and 13b.

Specifically, the electronic device 10 has a first torque generation mechanism which generates torque as drag against the turn when the first casing 11 turns with respect to the hinge folders 13a and 13b. Further, the electronic device 10 also has a second torque generation mechanism which generates torque as drag against the turn when the second casing 12 turns with respect to the hinge folders 13a and 13b. In addition, the electronic device 10 is configured such that the magnitude of the torque generated by the first torque generation mechanism is smaller than the magnitude of the torque generated by the second torque generation mechanism.

Further, in this example, the electronic device 10 has a mechanism of generating a force to maintain the turning angle (for example, torque as drag against the turn) in a state where the turning angle is 0 degree, 180 degrees, or 360 degrees. It should be noted that the electronic device 10 may be configured to generate a force to maintain the turning angle in a state where the turning angle is an angle other than 0 degree, 180 degrees, or 360 degrees (e.g., 160 degrees).

Further, the electronic device 10 includes a first display 11d and a second display 12d, as shown in FIG. 13.

The first display 11d is a touch panel which displays information and to which information can be input with a touch by a user. The first display 11d is disposed on the front surface 11s1 of the first casing 11. The first display 11d extends to a position between the two connecting portions 11a and 11b in the short side direction of the first casing 11 (in this example, to an end in the short side direction of the first casing 11).

The second display 12d is a touch panel which displays information and to which information can be input with a touch by a user. The second display 12d is disposed on the front surface 12s1 of the second casing 12. The second display 12d extends to a position between the two connecting portions 12a and 12b in the short side direction of the second casing 12 (in this example, to an end in the short side direction of the second casing 12).

With this configuration, as it is possible to prevent interference with the hinge structure (namely, the connecting portions 11a to 12b and the hinge folders 13a and 13b), the clearance between the first display 11d and the second display 12d can be further reduced.

It should be noted that while the electronic device 10 includes touch panels, the electronic device 10 may include display panels for displaying information. Further, while the electronic device 10 includes two touch panels, the electronic device 10 may include one touch panel and one operation input unit (e.g., key buttons, for example).

Figure 21:
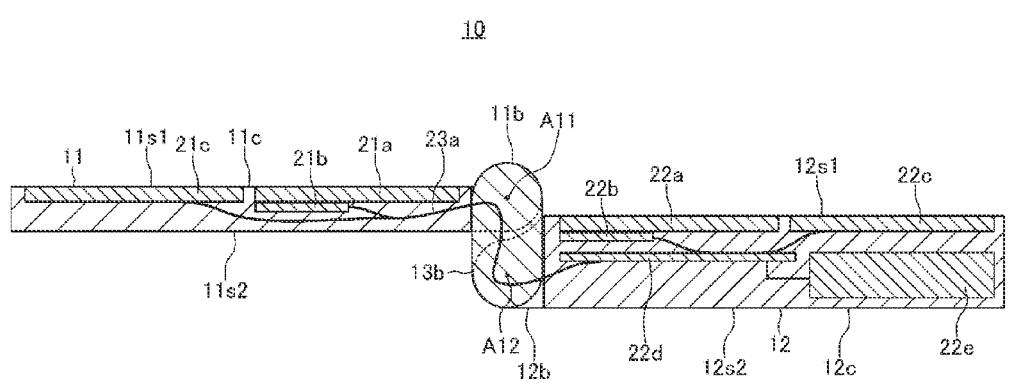
FIG. 21 is a diagram showing a schematic configuration of an electronic device according to an exemplary variation of the first exemplary embodiment of the present invention.

Further, the electronic device 10 may be configured such that each casing includes one display and one operation input unit. In that case, as shown in FIG. 21, the electronic device 10 includes a first display 21a, a first display control unit 21b, a first operation input unit 21c, a second display 22a, a second display control unit 22b, a second operation input unit 22c, a circuit board 22d, and a power supply unit 22e including a battery.

The first display 21a and the first operation input unit 21c are disposed on the front surface 11s1 of the first casing 11. The first display control unit 21b is accommodated in the inner space of the first casing 11.

The second display 22a and the second operation input unit 22c are disposed on the front surface 12s1 of the second casing 12. The second display control unit 22b, the circuit board 22d, and the power supply unit 22e are accommodated in the inner space of the second casing 12.

The first display control unit 21b, the first operation input unit 21c, the second display control unit 22b, the second operation input unit 22c, the power supply unit 22e, and the circuit board 22d are connected via wiring 23a. The power supply unit 22e supplies electric power to the circuit board 22d.

It should be noted that the first display control unit 21b and the first operation input unit 21c may be connected with the circuit board 22d wirelessly. In that case, the electronic device 10 may be configured to transmit power wirelessly, in addition to signals. Further, the electronic device 10 may be configured such that each of the first casing 11 and the second casing 12 has a power supply unit.

As described above, according to the electronic device 10 of the first exemplary embodiment of the present invention, even if the thickness of the first casing 11 is smaller than the thickness T11a of the connecting portion 11a or 11b (first casing-side connecting portion) in the reference direction D10, in a state where the turning angle is 0 degree or a state where the turning angle is 360 degrees, it is possible to prevent the first casing-side connecting portions from protruding from the plane P11, of the first casing 11, formed by the part other than the first casing-side connecting portions.

Further, the electronic device 10 according to the first exemplary embodiment of the present invention is configured such that when a state is changed from a state where the turning angle is 0 degree to a state where the turning angle is 180 degrees, the first casing 11 turns with respect to the hinge folders 13a and 13b while the second casing 12 does not turn with respect to the hinge folder s13a and 13b.

With this configuration, in a state where the turning angle is 180 degrees, a clearance between the first casing 11 and the second casing 12, when viewed from a direction orthogonal to the front surface 11s1 of the first casing 11, can be reduced. Consequently, in a state where the turning angle is 180 degrees, the clearance between the first display 11d and the second display 12d can be reduced sufficiently.

In addition, the electronic device 10 according to the first exemplary embodiment of the present invention is configured such that the first display 11d extends to a position between the two connecting portions 11a and 11b (first casing-side connecting portions), and the second display 12d extends to a position between the two connecting portions 12a and 12b (second casing-side connecting portions).

With this configuration, the clearance between the first display 11d and the second display 12d can be further reduced.

It should be noted that while the electronic device 10 according to the first exemplary embodiment is configured such that the turning angle is changed by applying a force, in a turning direction, to the first casing 11 and the second casing 12 by the user, the electronic device 10 may be configured such that the turning angle is changed by pressing a button by the user (that is, may include an automatic open/close mechanism).

It should be noted that while the electronic device 10 according to the first exemplary embodiment is configured such that the turning angle is changeable between 0 degree to 360 degrees, the electronic device 10 may be configured such that the turning angle is changeable between 0 degree to 180 degrees.

Second Exemplary Embodiment

Figure 22:
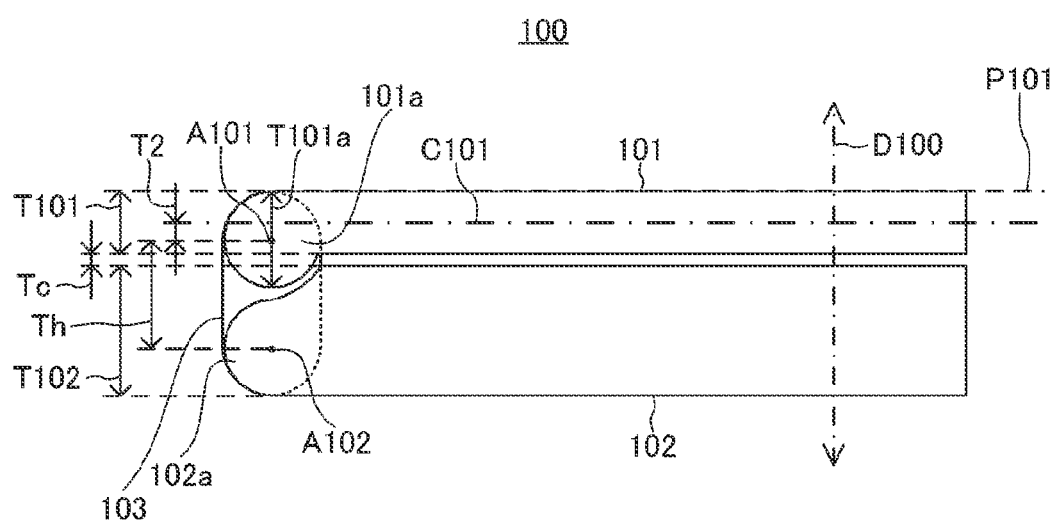
FIG. 22 is a diagram showing a schematic configuration of an electronic device according to a second exemplary embodiment of the present invention.

Next, an electronic device according to a second exemplary embodiment of the present invention will be described with reference to FIG. 22.

An electronic device 100 according to a second exemplary embodiment includes a first casing 101 in a flat plate shape having a substantially uniform thickness and including a front surface and a rear surface parallel to the front surface;

a second casing 102 in a flat plate shape having a substantially uniform thickness and including a front surface and a rear surface parallel to the front surface; and a connecting member 103 that connects the first casing 101 and the second casing 102, in which the connecting member 103 engages with the first casing 101 in such a manner as to allow the first casing 101 to turn about a first axis of rotation A101 passing through a first casing-side connecting portion 101a formed at one end of the first casing 101, and engages with the second casing 102 in such a manner as to allow the second casing 102 to turn about a second axis of rotation A102 passing through a second casing-side connecting portion 101a formed at one end of the second casing 101, to thereby allow a turning angle which is an angle formed by the first casing 101 and the second casing 102 to be changeable between 0 degree and 360 degrees.

The electronic device 100 is configured such that in a state where the turning angle is 0 degree or the turning angle is 360 degrees, a distance Th between the first axis of rotation A101 and the second axis of rotation A102 in a reference direction D100, which is a direction orthogonal to the front surface of the first casing 101, equals to the sum calculated by adding a half of the sum of a thickness T101 of the first casing 101 and a thickness T102 of the second casing 102, and a clearance Tc between the first casing 101 and the second casing 102 in the reference direction D100, and that the first axis of rotation A101 is arranged at a position shifted from the center C101 of the first casing 101 in the reference direction D100 to the second casing 102 side, by a half T2 of the value calculated by subtracting the thickness T101 of the first casing 101 from a thickness T101a of the first casing-side connecting portion 101a in the reference direction D100.

According to this configuration, even in the case where the thickness T101 of the first casing 101 is smaller than the thickness T101a of the first casing-side connecting portion 101a in the reference direction D100, in a state where the turning angle is 0 degree or a state where the turning angle is 360 degrees, it is possible to prevent the first casing-side connecting portion 101a from protruding from a plane P101 formed by the part other than the first casing-side connecting portion 101a of the first casing 101.

Third Exemplary Embodiment

Configuration

As shown in FIGS. 23 to 29, an electronic device 10 according to a third exemplary embodiment is a folding mobile telephone terminal. It should be noted that the electronic device 10 may be a smart phone, a PHS (Personal Handy phone System), a PDS (Personal Data Assistance, Personal Digital Assistant), a car navigation terminal, a laptop PC, a game console, or the like.

The electronic device 10 includes a first casing 11, a second casing 12, and two hinge folders 13a and 13b. The electronic device 10 may include only one hinge folder, or three or more hinge folders.

The first casing 11 is a flat plate-like member in a rectangle shape having short sides and long sides in a front view, and has a substantially uniform thickness. The first casing 11 has a space formed therein. The first casing 11 is configured of two connecting portions 11a and 11b, and a flat plate portion 11c.

Each of the two connecting portions 11a and 11b is formed by bending the first casing 11. The two connecting portions 11a and 11b are arranged at one end in a short side direction. Each of the two connecting portions 11a and 11b is arranged at either end in a long side direction. It should be noted that a first axis of rotation A11 is arranged parallel to the long side direction, as described below. Accordingly, it can also be said that the two connecting portions 11a and 11b are formed at both ends in a direction along the first axis of rotation A11, respectively.

The flat plate portion 11c is a part other than the two connecting portions 11a and 11b of the first casing 11. The flat plate portion 11c includes a front surface 11s1 which is one outer wall surface in a thickness direction, and a rear surface 11s2 which is the other outer wall surface in the thickness direction (that is, parallel to the front surface 11s1).

The second casing 12 is a flat plate-like member in a rectangle shape having short sides and long sides in a front view, and has a substantially uniform thickness. The thickness of the second casing 12 is larger than the thickness of the first casing. The second casing 12 has a space formed therein. The second casing 12 is configured of two connecting portions 12a and 12b, and a flat plate portion 12c.

Each of the two connecting portions 12a and 12b is formed by bending the second casing 12. The two connecting portions 12a and 12b are arranged at one end in a short side direction. Each of the two connecting portions 12a and 12b is arranged at either end in a long side direction. It should be noted that a second axis of rotation A12 is arranged parallel to the long side direction, as described below. Accordingly, it can also be said that the two connecting portions 12a and 12b are formed at both ends in a direction along the second axis of rotation A12, respectively.

The flat plate portion 12c is a part other than the two connecting portions 12a and 12b of the second casing 12. The flat plate portion 12c includes a front surface 12s1 which is one outer wall surface in a thickness direction, and a rear surface 12s2 which is the other outer wall surface in the thickness direction (that is, parallel to the front surface 12s1).

Figure 23:
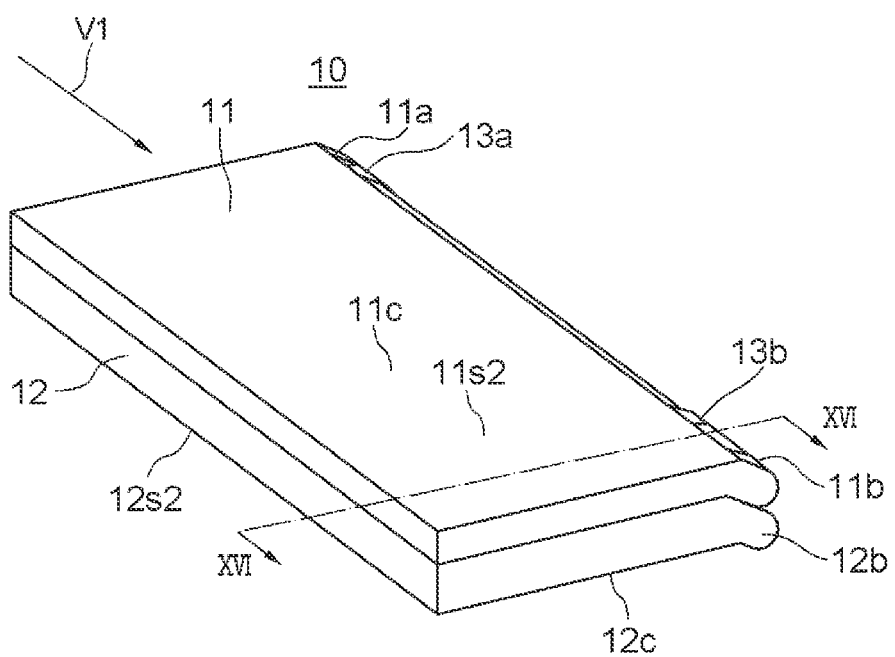
FIG. 23 is a perspective view of an electronic device according to a third exemplary embodiment of the present invention in a state where the turning angle is 0 degree.
Figure 24:
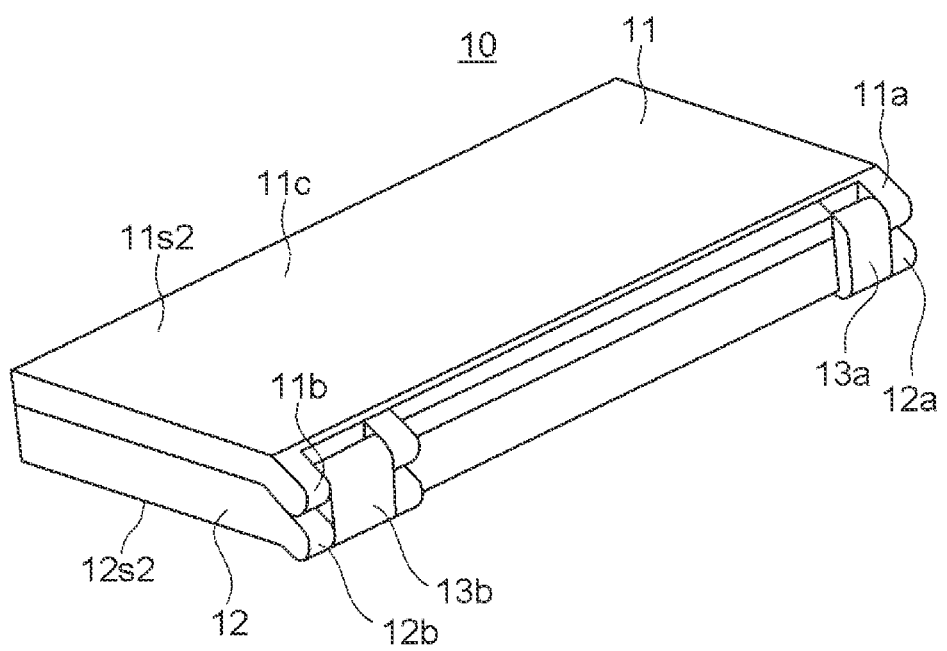
FIG. 24 is a perspective view of an electronic device according to the third exemplary embodiment of the present invention in a state where the turning angle is 0 degree.
Figure 25:
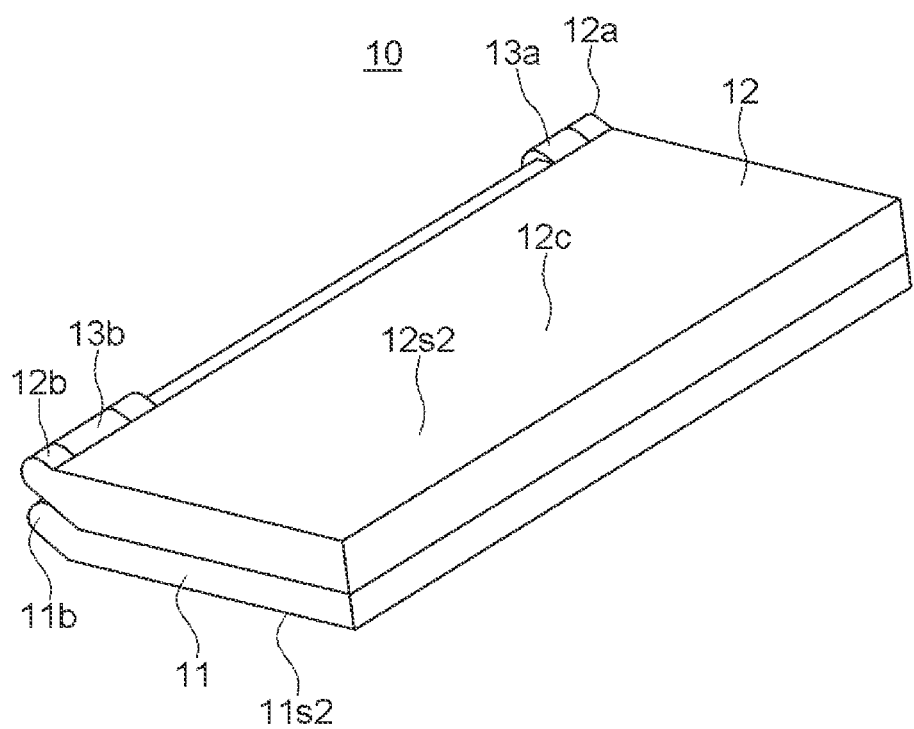
FIG. 25 is a perspective view of the electronic device according to the third exemplary embodiment of the present invention in a state where the turning angle is 0 degree.
Figure 30:
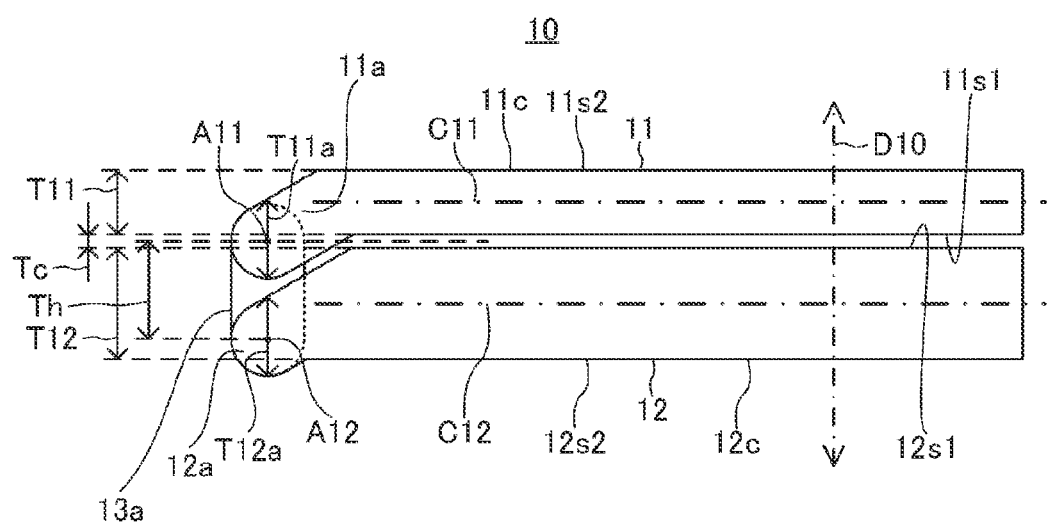
FIG. 30 is a side view of the electronic device seen toward a direction shown by an arrow V1 of FIG. 23.

The hinge folder 13a engages with the first casing 11 in such a manner as to allow the first casing 11 to turn about the first axis of rotation A11, as shown in FIG. 30 which is a side view when the electronic device 10 is viewed toward a direction shown by an arrow V1 of FIG. 23. In this example, the hinge folder 13a engages with the first casing 11 via a shaft, not shown, in such a manner as to allow the first casing 11 to turn.

Similarly, the hinge folder 13b engages with the first casing 11 in such a manner as to allow the first casing 11 to turn about the first axis of rotation A11, as in the case with the hinge folder 13a. The first axis of rotation A11 is disposed so as to pass through the connecting portions 11a and 11b. In this example, the hinge folder 13b engages with the first casing 11 via a shaft, not shown, in such a manner as to allow the first casing 11 to turn.

The first casing 11 is configured to be able to turn 180 degrees with respect to the two hinge folders 13a and 13b.

Figure 31:
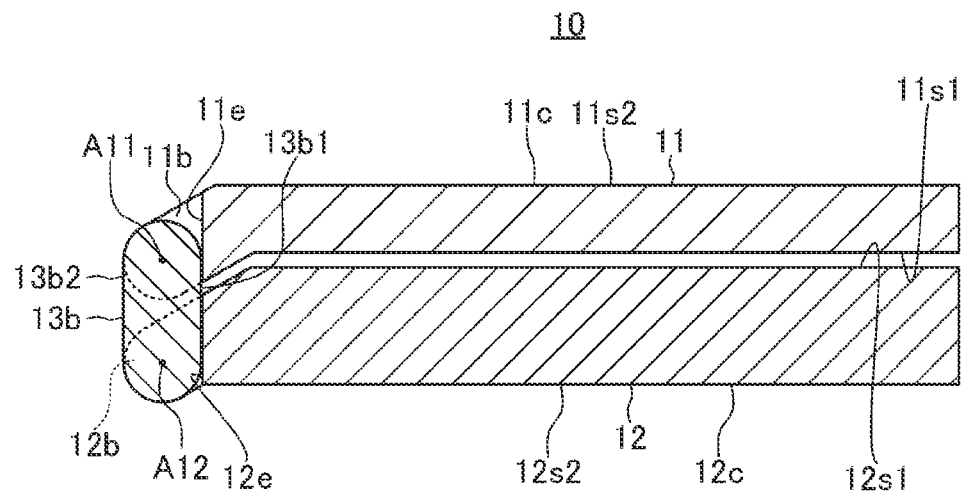
FIG. 31 is a cross-sectional view of the electronic device taken along the line XVI-XVI of FIG. 23.

Specifically, as shown in FIG. 31 which is a cross-sectional view of the electronic device 10 taken along a line XVI-XVI of FIG. 23, a side wall surface 13b1 on the right side, in FIG. 31, of the hinge folder 13b and a side wall surface 11e on the left side, in FIG. 31, of the first casing 11 (side wall surface on the hinge folder 13b side of the flat plate portion 11c) contact each other, whereby the first casing 11 is prevented from being turned in a clockwise direction in FIG. 31 with respect to the hinge folder 13b.

Figure 32:
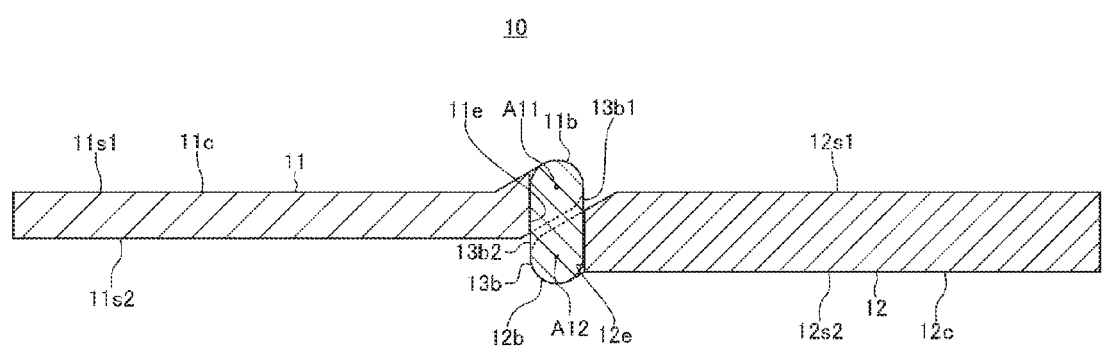
FIG. 32 is a diagram showing the electronic device in which the first casing of FIG. 31 is turned 180 degrees in a counterclockwise direction with respect to hinge folders.

FIG. 32 shows the electronic device 10 in the case where the first casing 11 in FIG. 31 is turned 180 degrees in a counterclockwise direction with respect to the hinge folder 13b. As shown in FIG. 32, in this state, a side wall surface 13b2 on the left side, in FIG. 32, of the hinge folder 13b and the side wall surface 11e on the right side, in FIG. 32, of the first casing 11 (side wall surface on the hinge folder 13b side of the flat plate portion 11c) contact each other, whereby the first casing 11 is prevented from being turned in a counterclockwise direction in FIG. 32 with respect to the hinge folder 13b.

It should be noted that the hinge folder 13a also regulates a turn of the first casing 11, as is the case with the hinge folder 13b.

In this way, the first casing 11 is configured to be able to turn 180 degrees with respect to the two hinge folders 13a and 13b.

Further, as shown in FIG. 30, the hinge folder 13a engages with the second casing 12 in such a manner as to allow the second casing 12 to turn about the second axis of rotation A12. In this example, the hinge folder 13a engages with the second casing 12 via a shaft, not shown, in such a manner as to allow the second casing 12 to turn.

Similarly, the hinge folder 13b engages with the second casing 12 in such a manner as to allow the second casing 12 to turn about the second axis of rotation A12, as in the case with the hinge folder 13a. In this example, the hinge folder 13b engages with the second casing 12 via a shaft, not shown, in such a manner as to allow the second casing 12 to turn.

The second axis of rotation A12 is disposed so as to pass through the connecting portions 12a and 12b. Further, the second axis of rotation A12 is arranged parallel to the first axis of rotation A11.

The second casing 12 is configured to be able to turn 180 degrees with respect to the two hinge folders 13a and 13b.

Specifically, as shown in FIG. 32, a side wall surface 13b1 on the right side, in FIG. 32, of the hinge folder 13b and a side wall surface 12e on the left side, in FIG. 32, of the second casing 12 (side wall surface on the hinge folder 13b side of the flat plate portion 12c) contact each other, whereby the second casing 12 is prevented from being turned in a counterclockwise direction in FIG. 32 with respect to the hinge folder 13b.

Figure 33:
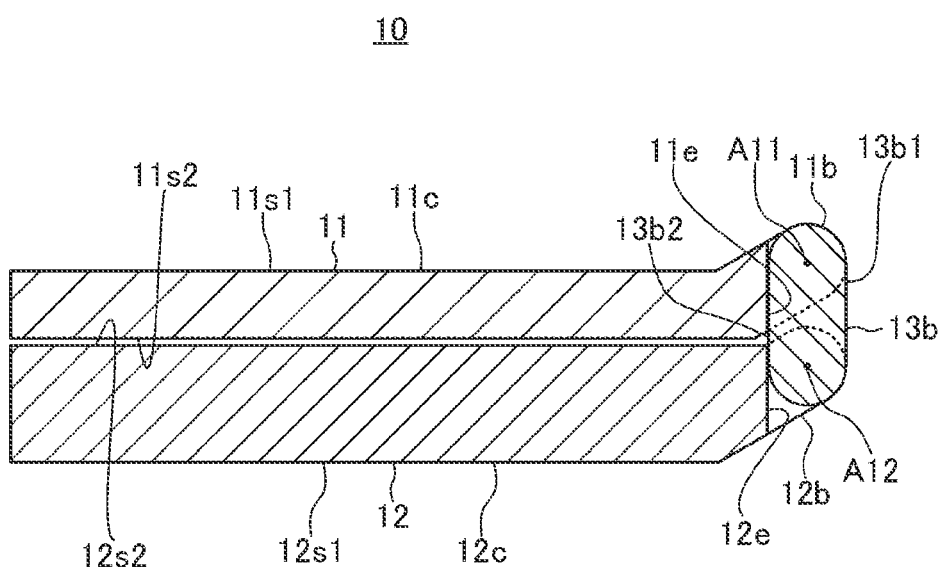
FIG. 33 is a diagram showing the electronic device in which the second casing of FIG. 32 is turned 180 degrees in a clockwise direction with respect to hinge folders.

FIG. 33 shows the electronic device 10 in the case where the second casing 12 in FIG. 32 is turned 180 degrees in a clockwise direction with respect to the hinge folder 13b. As shown in FIG. 33, in this state, a side wall surface 13b2 on the left side, in FIG. 33, of the hinge folder 13b and the side wall surface 12e on the right side, in FIG. 33, of the second casing 12 (side wall surface on the hinge folder 13b side of the flat plate portion 12c) contact each other, whereby the second casing 12 is prevented from being turned in a clockwise direction in FIG. 33 with respect to the hinge folder 13b.

It should be noted that the hinge folder 13a also regulates a turn of the second casing 12, as in the case with the hinge folder 13b.

In this way, the second casing 12 is configured to be able to turn 180 degrees with respect to the two hinge folders 13a and 13b.

With this configuration, the first casing 11 and the second casing 12 turn independently of each other with respect to the two hinge folders 13a and 13b.

Further, with this configuration, the two hinge folders 13a and 13b connect the first casing 11 and the second casing 12 in such a manner that a turning angle formed by the first casing 11 and the second casing 12 is changeable between 0 degree and 360 degrees. As such, the two hinge folders 13a and 13b constitute connection members.

It can be said that the connecting portion 11a, the connecting portion 12a, and the hinge folder 13a constitute a parallel biaxial hinge. Similarly, it can be said that the connecting portion 11b, the connecting portion 12b, and the hinge folder 13b also constitute a parallel biaxial hinge.

Here, a turning angle will be described in more detail. In this example, a state where the turning angle is 0 degree is a state in which the front surface 11s1 of the first casing 11 and the front surface 12s1 of the second casing 12 face each other, and the front surface 11s1 of the first casing 11 and the front surface 12s1 of the second casing 12 are in parallel. As such, FIGS. 23 to 25, 30, and 31 show a state where the turning angle is 0 degree.

Further, a state where the turning angle is 360 degrees is a state in which the rear surface 11s2 of the first casing 11 and the rear surface 12s2 of the second casing 12 face each other, and the rear surface 11s2 of the first casing 11 and the rear surface 12s2 of the second casing 12 are in parallel. As such, FIGS. 27 to 29 and 33 show a state where the turning angle is 360 degrees.

Figure 26:
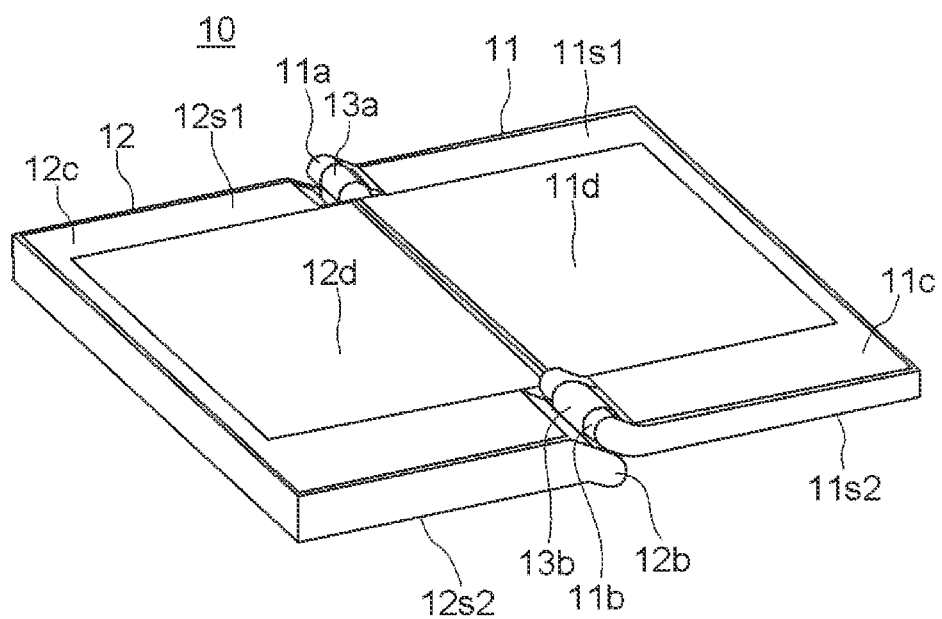
FIG. 26 is a perspective view of the electronic device according to the third exemplary embodiment of the present invention in a state where the turning angle is 180 degrees.
Figure 27:
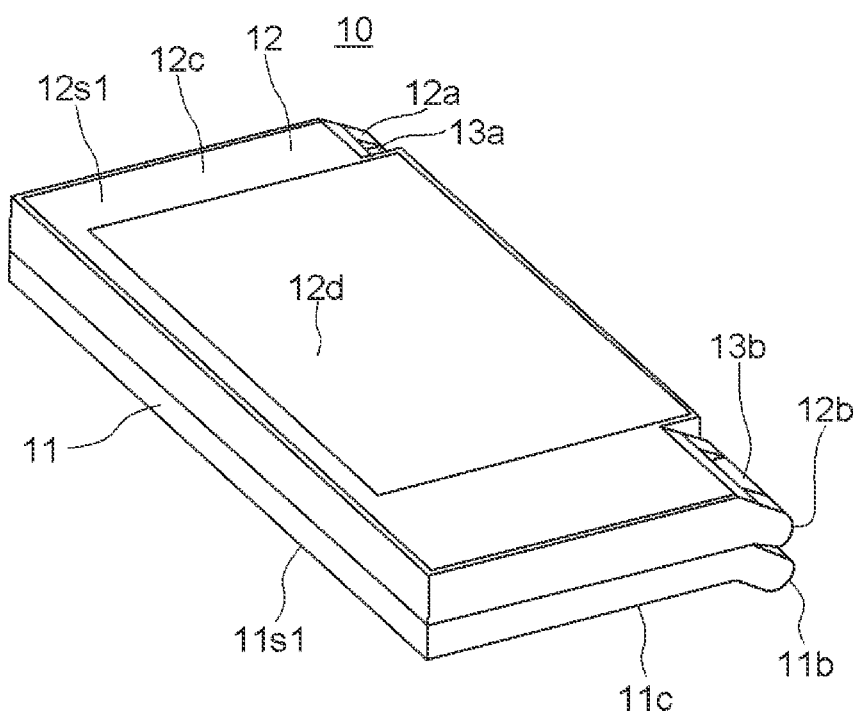
FIG. 27 is a perspective view of the electronic device according to the third exemplary embodiment of the present invention in a state where the turning angle is 360 degrees.
Figure 28:
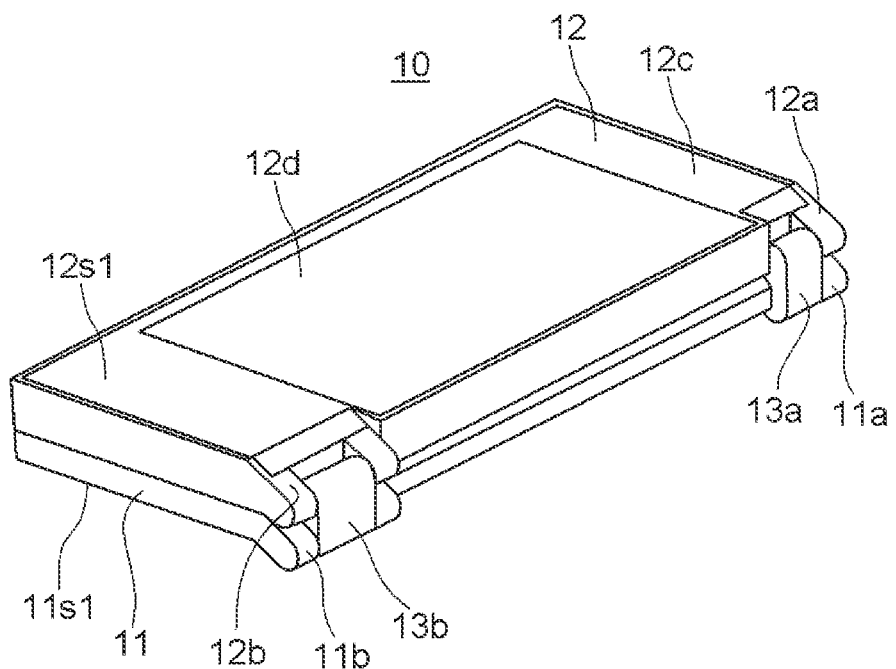
FIG. 28 is a perspective view of the electronic device according to the third exemplary embodiment of the present invention in a state where the turning angle is 360 degrees.
Figure 29:
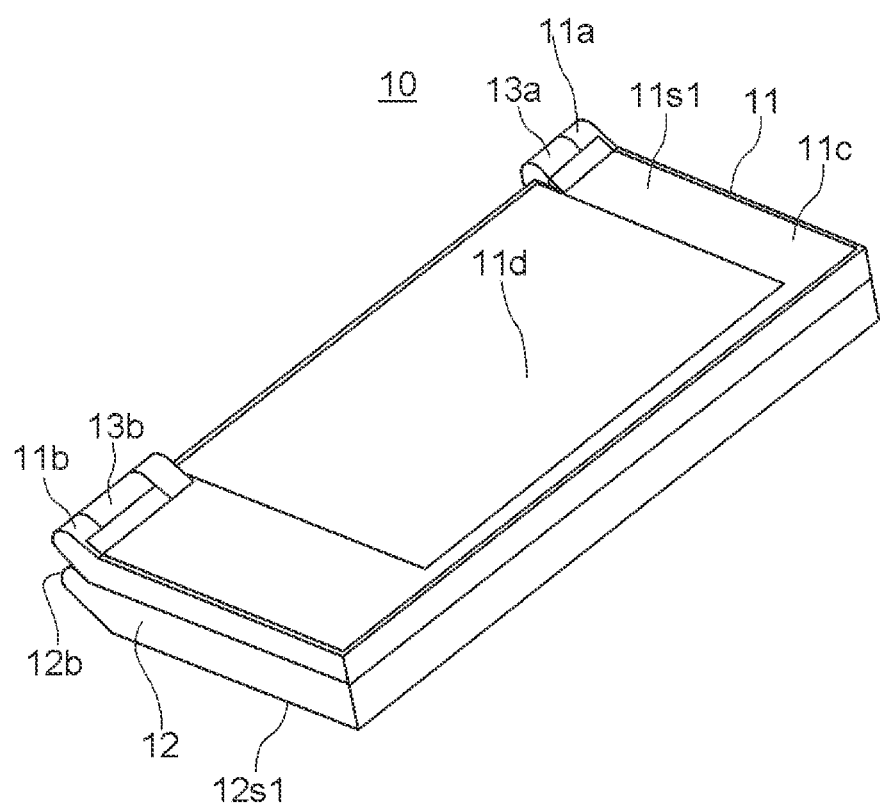
FIG. 29 is a perspective view of the electronic device according to the third exemplary embodiment of the present invention in a state where the turning angle is 360 degrees.

Further, a state where the turning angle is 180 degrees is a state in which the front surface 11s1 of the first casing 11 and the front surface 12s1 of the second casing 12 do not face each other, and the front surface 11s1 of the first casing 11 and the front surface 12s1 of the second casing 12 are in parallel. As such, FIGS. 26 and 32 show a state where the turning angle is 180 degrees.

Here, positions of the first axis of rotation A11 and the second axis of rotation A12 will be described in more detail.

As shown in FIG. 30, the first axis of rotation A11 is arranged parallel to the long side direction of the first casing 11. Similarly, the second axis of rotation A12 is arranged parallel to the long side direction of the second casing 12. Further, the first axis of rotation A11 is arranged parallel to the second axis of rotation A12.

Further, as shown in FIG. 30, in a state where the turning angle is 0 degree, the first axis of rotation A11 and the second axis of rotation A12 are arranged in a plane orthogonal to the short side direction of the first casing 11 (that is, on a line extending in a vertical direction in FIG. 30). It should be noted that in a state where the turning angle is 0 degree, the first axis of rotation A11 and the second axis of rotation A12 may be arranged at different positions in the short side direction of the first casing 11 (that is, a lateral direction in FIG. 17).

The electronic device 10 is configured such that in a state where the turning angle is 0 degree, a distance Th in a reference direction D10 between the first axis of rotation A11 and the second axis of rotation A12 equals to the sum T1+Tc calculated by adding a half T1 of the sum of the thickness T11 of the first casing 11 and the thickness T12 of the second casing 12, that is, T1=(T11+T12)/2, and a clearance Tc in the reference direction D10 between the first casing 11 and the second casing 12. Here, the reference direction D10 is a direction orthogonal to the front surface 11s1 of the first casing 11.

It should be noted that the electronic device 10 may be configured such that in a state where the turning angle is 360 degrees, the distance in the reference direction D10 between the first axis of rotation A11 and the second axis of rotation A12 equals to the sum calculated by adding a half of the sum of the thickness of the first casing 11 and the thickness of the second casing 12, and the clearance in the reference direction D10 between the first casing 11 and the second casing 12.

Further, the electronic device 10 is configured such that in a state where the turning angle is 0 degree, the first axis of rotation A11 is arranged at a position shifted from (a position within the plane forming) the front surface 11s1 of the first casing 11 to the second casing side, by a half of the clearance Tc between the first casing 11 and the second casing 12 in the reference direction D10.

It should be noted that the electronic device 10 may be configured such that in a state where the turning angle is 360 degrees, the first axis of rotation A11 is arranged at a position shifted from (a position within the plane forming) the front surface 11s1 of the first casing 11 to the second casing side, by a half of the clearance between the first casing 11 and the second casing 12 in the reference direction D10.

With this configuration, in a state where the turning angle is 180 degrees, the electronic device 10 is able to allow the front surface 11o of the first casing 11 and the front surface 12s1 of the second casing to form the same plane.

In addition, the electronic device 10 is configured such that in a state where the turning angle is 0 degree, the sum T11a+T12a, calculated by adding a thickness T11a of the connecting portion 11a or 11b in the reference direction D10 at a position passing through the first axis of rotation A11 and a thickness T12a of the connecting portion 12a or 12b in the reference direction D10 at a position passing through the second axis of rotation A12 (outer radial of the connecting portions 12a and 12b), is smaller than the sum T11+T12+Td, calculated by adding the thickness T11 of the first casing 11, the thickness T12 of the second casing 12, and the clearance Tc between the first casing 11 and the second casing 12 in the reference direction D10.

It should be noted that the electronic device 10 may be configured such that in a state where the turning angle is 360 degrees, the sum of the thickness of the connecting portion 11a, 11b in the reference direction D10 at a position passing through the first axis of rotation A11 and the thickness of the connecting portion 12a, 12b in the reference direction D10 passing through the second axis of rotation A12, is smaller than the sum of the thickness of the first casing 11, the thickness of the second casing 12, and the clearance between the first casing 11 and the second casing 12 in the reference direction D10.

With this configuration, in a state where the turning angle is 0 degree or a state where the turning angle is 360 degrees, the electronic device 10 is able to form a predetermined clearance between the first casing 11 and the second casing 12. Further, in the electronic device 10, the turning angle can be changed between 0 degree and 360 degrees.

Further, according to the above-described configuration, in a state where the turning angle is 180 degrees, it is possible to prevent formation of a difference in level between the front surface 11s1 of the first casing 11 and the front surface 12s1 of the second casing 12.

Further, the electronic device 10 is configured such that when a state is changed from a state where the turning angle is 0 degree to a state where the turning angle is 180 degrees, the first casing 11 turns with respect to the hinge folders 13a and 13b while the second casing 12 does not turn with respect to the hinge folders 13a and 13b.

Specifically, the electronic device 10 has a first torque generation mechanism which generates torque as drag against the turn when the first casing 11 turns with respect to the hinge folders 13a and 13b. Further, the electronic device 10 also has a second torque generation mechanism which generates torque as drag against the turn when the second casing 12 turns with respect to the hinge folders 13a and 13b. In addition, the electronic device 10 is configured such that the magnitude of the torque generated by the first torque generation mechanism is smaller than the magnitude of the torque generated by the second torque generation mechanism.

Further, in this example, the electronic device 10 has a mechanism of generating a force to maintain the turning angle (for example, torque as drag against the turn) in a state where the turning angle is 0 degree, 180 degrees, or 360 degrees. It should be noted that the electronic device 10 may be configured to generate a force to maintain the turning angle in a state where the turning angle is an angle other than 0 degree, 180 degrees, or 360 degrees (e.g., 160 degrees).

Further, the electronic device 10 includes a first display 11d and a second display 12d, as shown in FIG. 26.

The first display 11d is a touch panel which displays information and to which information can be input with a touch by a user. The first display 11d is disposed on the front surface 11s1 of the first casing 11. The first display 11d extends to a position between the two connecting portions 11a and 11b in the short side direction of the first casing 11 (in this example, to an end in the short side direction of the first casing 11).

The second display 12d is a touch panel which displays information and to which information can be input with a touch by a user. The second display 12d is disposed on the front surface 12s1 of the second casing 12. The second display 12d extends to a position between the two connecting portions 12a and 12b in the short side direction of the second casing 12 (in this example, to an end in the short side direction of the second casing 12).

With this configuration, as it is possible to prevent interference with the hinge structure (namely, the connecting portions 11a to 12b and the hinge folders 13a and 13b), the clearance between the first display 11d and the second display 12d can be further reduced.

It should be noted that while the electronic device 10 includes touch panels, the electronic device 10 may include display panels for displaying information. Further, while the electronic device 10 includes two touch panels, the electronic device 10 may include one touch panel and one operation input unit (key buttons, for example).

Figure 34:
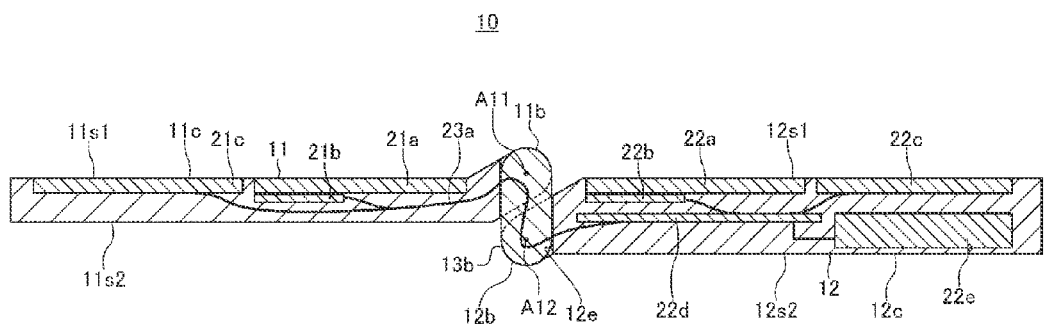
FIG. 34 is a diagram showing a schematic configuration of an electronic device according to an exemplary variation of the third exemplary embodiment of the present invention.

Further, the electronic device 10 may be configured such that each casing includes one display and one operation input unit. In that case, as shown in FIG. 34, the electronic device 10 includes a first display 21a, a first display control unit 21b, a first operation input unit 21c, a second display 22a, a second display control unit 22b, a second operation input unit 22c, a circuit board 22d, and a power supply unit 22e including a battery.

The first display 21a and the first operation input unit 21c are disposed on the front surface 11s1 of the first casing 11. The first display control unit 21b is accommodated in the inner space of the first casing 11.

The second display 22a and the second operation input unit 22c are disposed on the front surface 12s1 of the second casing 12. The second display control unit 22b, the circuit board 22d, and the power supply unit 22e are accommodated in the inner space of the second casing 12.

The first display control unit 21b, the first operation input unit 21c, the second display control unit 22b, the second operation input unit 22c, the power supply unit 22e, and the circuit board 22d are connected via wiring 23a. The power supply unit 22e supplies electric power to the circuit board 22d.

It should be noted that the first display control unit 21b and the first operation input unit 21c, and the circuit board 22d may be connected wirelessly. In that case, the electronic device 10 may be configured to wirelessly transmit power, in addition to signals. Further, the electronic device 10 may be configured such that each of the first casing 11 and the second casing 12 has a power supply unit.

As described above, according to the electronic device 10 of the third exemplary embodiment of the present invention, in a state where the turning angle is 180 degrees, it is possible to prevent formation of a difference in level between the front surface 11s1 of the first casing 11 and the front surface 12s1 of the second casing 12. Accordingly, in the case where displays are disposed on the front surface 110 of the first casing 11 and the front surface 12s1 of the second casing 12, respectively, it is possible to display information on the two displays on the same plane.

Further, in the case where touch panels, to which information can be input with a touch by a user, are disposed on the front surface 11s1 of the first casing 11 and the front surface 12s1 of the second casing 12, respectively, the user is able to input information by touching two touch panels on the same plane. Accordingly, the user is able to input information smoothly.

Further, the electronic device 10 according to the third exemplary embodiment of the present invention is configured such that when a state is changed from a state where the turning angle is 0 degree to a state where the turning angle is 180 degrees, the first casing 11 turns with respect to the hinge folders 13a and 13b while the second casing 12 does not turn with respect to the hinge folder s13a and 13b.

With this configuration, in a state where the turning angle is 180 degrees, a clearance between the first casing 11 and the second casing 12, when viewed from a direction orthogonal to the front surface 11s1 of the first casing 11, can be reduced.

Consequently, in a state where the turning angle is 180 degrees, the clearance between the first display 11d and the second display 12d can be reduced sufficiently.

In addition, the electronic device 10 according to the third exemplary embodiment of the present invention is configured such that the first display 11d extends to a position between the two connecting portions 11a and 11b (first casing-side connecting portions), and the second display 12d extends to a position between the two connecting portion 12a and 12b (second casing-side connecting portions).

With this configuration, the clearance between the first display 11d and the second display 12d can be further reduced.

It should be noted that while the electronic device 10 according to the third exemplary embodiment is configured such that the turning angle is changed by applying a force, in a turning direction, to the first casing 11 and the second casing 12 by the user, the electronic device 10 may be configured such that the turning angle is changed by pressing a button by the user (that is, may include an automatic open/close mechanism).

It should be noted that while the electronic device 10 according to the third exemplary embodiment is configured such that the turning angle is changeable between 0 degree to 360 degrees, the electronic device 10 may be configured such that the turning angle is changeable between 0 degree to 180 degrees.

Fourth Exemplary Embodiment

Figure 35:
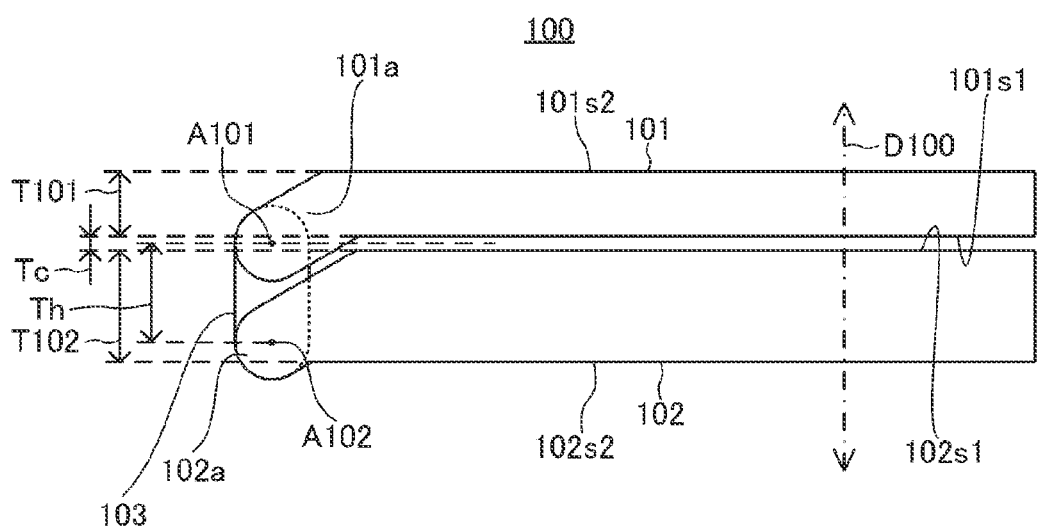
FIG. 35 is a diagram showing a schematic configuration of an electronic device according to a fourth exemplary embodiment of the present invention.

Next, an electronic device according to a fourth exemplary embodiment of the present invention will be described with reference to FIG. 35.

An electronic device 100 according to the fourth exemplary embodiment includes a first casing 101 in a flat plate shape having a substantially uniform thickness and including a front surface 101s1 and a rear surface 101s2 parallel to the front surface 101s1;

a second casing 102 in a flat plate shape having a substantially uniform thickness and including a front surface 102s1 and a rear surface 102s2 parallel to the front surface 102s1; and a connecting member 103 that connects the first casing 101 and the second casing 102, in which the connecting member 103 engages with the first casing 101 in such a manner as to allow the first casing 101 to turn about a first axis of rotation A101 passing through a first casing-side connecting portion 101a formed at one end of the first casing 101, and engages with the second casing 102 in such a manner as to allow the second casing 102 to turn about a second axis of rotation A102 passing through a second casing-side connecting portion 101a formed at one end of the second casing 101, to thereby allow a turning angle which is an angle formed by the first casing 101 and the second casing 102 to be changeable between 0 degree and 360 degrees.

The electronic device 100 is configured such that in a state where the turning angle is 0 degree or the turning angle is 360 degrees, the front surface 101s1 of the first casing 101 and the front surface 102s1 of the second casing 102 face each other, and that in a state where the turning angle is 180 degrees, the front surface 101s1 of the first casing 101 and the front surface 102s1 of the second casing 102 form the same plane.

According to this configuration, in a state where the turning angle is 180 degrees, it is possible to prevent formation of a difference in level between the front surface 101s1 of the first casing 101 and the front surface 102s1 of the second casing 102. Accordingly, in the case where displays are disposed on the front surface 101s1 of the first casing 101 and the front surface 102s1 of the second casing 102, respectively, it is possible to display information on the two displays on the same plane.

Further, in the case where touch panels, to which information can be input with a touch by a user, are disposed on the front surface 101s1 of the first casing 101 and the front surface 102s1 of the second casing 102, respectively, the user is able to input information by touching the two touch panels on the same plane. Accordingly, the user is able to input information smoothly.

While the present invention has been described with reference to the exemplary embodiments described above, the present invention is not limited to the above-described embodiments. The form and details of the present invention can be changed within the scope of the present invention in various manners that can be understood by those skilled in the art.

Further, as other variations of the exemplary embodiments described above, any combinations of the above-described embodiments and variations may be adopted.

<Supplementary Notes>

The whole or part of the exemplary embodiments disclosed above can be described as, but not limited to, the following supplementary notes.

(Supplementary Note 1)

An electronic device comprising:

a first casing in a flat plate shape having a substantially uniform thickness, the first casing including a front surface and a rear surface parallel to the front surface;

a second casing in a flat plate shape having a substantially uniform thickness, the second casing including a front surface and a rear surface parallel to the front surface; and a connecting member that connects the first casing and the second casing, the connecting member engaging with the first casing in such a manner as to allow the first casing to turn about a first axis of rotation passing through a first casing-side connecting portion formed at one end of the first casing, and engaging with the second casing in such a manner as to allow the second casing to turn about a second axis of rotation passing through a second casing-side connecting portion formed at one end of the second casing, thereby allowing a turning angle which is an angle formed by the first casing and the second casing to be changeable between 0 degree and 360 degrees, wherein the electronic device is configured such that in a state where the turning angle is 0 degree or a state where the turning angle is 360 degrees, a distance between the first axis of rotation and the second axis of rotation in a reference direction, which is a direction orthogonal to the front surface of the first casing, equals to a sum calculated by adding a half of a sum of a thickness of the first casing and a thickness of the second casing, and a clearance between the first casing and the second casing in the reference direction, and that the first axis of rotation is arranged at a position shifted from a center of the first casing in the reference direction to a side of the second casing, by a half of a value calculated by subtracting the thickness of the first casing from a thickness of the first casing-side connecting portion in the reference direction.

With this configuration, even if the thickness of the first casing is smaller than the thickness of the first casing-side connecting portion in the reference direction, in a state where the turning angle is 0 degree or a state where the turning angle is 360 degrees, it is possible to prevent the first casing-side connecting portion from protruding from the plane formed by the part other than the first casing-side connecting portion of the first casing.

(Supplementary Note 2)

The electronic device according to supplementary note 1, wherein the first casing and the second casing are configured to turn independently of each other with respect to the connecting member, each of the first casing and the second casing is configured to be able to turn 180 degrees with respect to the connecting member, and the electronic device is configured such that when a state is changed from a state where the turning angle is 0 degree to a state where the turning angle is 180 degrees, the first casing turns with respect to the connecting member while the second casing does not turn with respect to the connecting member.

With this configuration, in a state where the turning angle is 180 degrees, the clearance between the first casing and the second casing, when viewed from a direction orthogonal to the front surface of the first casing 11, can be reduced. Consequently, if displays are disposed on the first casing and the second casing, respectively, the clearance between the two displays, in a state where the turning angle is 180 degrees, can be reduced sufficiently.

(Supplementary Note 3)

The electronic device according to supplementary note 1 or 2, wherein the first casing-side connecting portions are formed at both ends, in a direction along the first axis of rotation, of the first casing, respectively, the second casing-side connecting portions are formed at both ends, in a direction along the second axis of rotation, of the second casing, respectively, the electronic device is configured such that in a state where the turning angle is 0 degree, the front surface of the first casing and the front surface of the second casing face each other, on the front surface of the first casing, a first display for displaying information is disposed to extend to a position between the first casing-side connecting portions, and on the front surface of the second casing, a second display for displaying information is disposed to extend to a position between the second casing-side connecting portions.

With this configuration, the clearance between the first display and the second display can be further reduced.

(Supplementary Note 4)

The electronic device according to any of supplementary notes 1 to 3, wherein the electronic device is configured such that in a state where the turning angle is 0 degree or a state where the turning angle is 360 degrees, a sum of the thickness of the first casing-side connecting portion in the reference direction and a thickness of the second casing-side connecting portion in the reference direction is smaller than a sum of the thickness of the first casing, the thickness of the second casing, and the clearance between the first casing and the second casing in the reference direction.

(Supplementary Note 5)

The electronic device according to any of supplementary notes 1 to 4, wherein the electronic device is a mobile telephone terminal.

(Supplementary Note 6)

An electronic device comprising:

a first casing in a flat plate shape having a substantially uniform thickness, the first casing including a front surface and a rear surface parallel to the front surface;

a second casing in a flat plate shape having a substantially uniform thickness, the second casing including a front surface and a rear surface parallel to the front surface; and a connecting member that connects the first casing and the second casing, the connecting member engaging with the first casing in such a manner as to allow the first casing to turn about a first axis of rotation passing through a first casing-side connecting portion formed at one end of the first casing, and engaging with the second casing in such a manner as to allow the second casing to turn about a second axis of rotation passing through a second casing-side connecting portion formed at one end of the second casing, thereby allowing a turning angle which is an angle formed by the first casing and the second casing to be changeable between 0 degree and 360 degrees, wherein the electronic device is configured such that in a state where the turning angle is 0 degree or a state where the turning angle is 360 degrees, the front surface of the first casing and the front surface of the second casing face each other, and the electronic device is configured such that in a state where the turning angle is 180 degrees, the front surface of the first casing and the front surface of the second casing form a same plane.

With this configuration, in a state where the turning angle is 180 degrees, it is possible to prevent formation of a difference in level between the front surface of the first casing and the front surface of the second casing. Accordingly, in the case where displays are disposed on the front surface of the first casing and the front surface of the second casing, respectively, it is possible to display information on the two displays on the same plane.

Further, in the case where touch panels, to which information can be input with a touch by a user, are disposed on the front surface of the first casing and the front surface of the second casing, respectively, the user is able to input information by touching two touch panels on the same plane. Accordingly, the user is able to input information smoothly.

(Supplementary Note 7)

The electronic device according to supplementary note 6, wherein the electronic device is configured such that in a state where the turning angle is 0 degree or a state where the turning angle is 360 degrees, a distance between the first axis of rotation and the second axis of rotation in a reference direction, which is a direction orthogonal to the front surface of the first casing, equals to a sum calculated by adding a half of a sum of a thickness of the first casing and a thickness of the second casing, and a clearance between the first casing and the second casing in the reference direction, and that the first axis of rotation is arranged at a position shifted from the front surface of the first casing to a side of the second casing, by a half of the clearance.

(Supplementary Note 8)

The electronic device according to supplementary note 6 or 7, wherein the first casing and the second casing are configured to turn independently of each other with respect to the connecting member, each of the first casing and the second casing is configured to be able to turn 180 degrees with respect to the connecting member, and the electronic device is configured such that when a state is changed from a state where the turning angle is 0 degree to a state where the turning angle is 180 degrees, the first casing turns with respect to the connecting member while the second casing does not turn with respect to the connecting member.

With this configuration, in a state where the turning angle is 180 degrees, the clearance between the first casing and the second casing, when the electronic device is viewed from a direction orthogonal to the front surface of the first casing 11, can be reduced. Consequently, if displays are disposed on the first casing and the second casing, respectively, the clearance between the two displays, in a state where the turning angle is 180 degrees, can be reduced sufficiently.

(Supplementary Note 9)

The electronic device according to any of supplementary notes 6 to 8, wherein the first casing-side connecting portions are formed at both ends, in a direction along the first axis of rotation, of the first casing, respectively, the second casing-side connecting portions are formed at both ends, in a direction along the second axis of rotation, of the second casing, respectively, on the front surface of the first casing, a first display for displaying information is disposed to extend to a position between the first casing-side connecting portions, and on the front surface of the second casing, a second display for displaying information is disposed to extend to a position between the second casing-side connecting portions.

With this configuration, the clearance between the first display and the second display can be further reduced.

(Supplementary Note 10)

The electronic device according to any of supplementary notes 6 to 9, wherein the electronic device is configured such that in a state where the turning angle is 0 degree or a state where the turning angle is 360 degrees, a sum of the thickness of the first casing-side connecting portion in the reference direction and a thickness of the second casing-side connecting portion in the reference direction is smaller than a sum of the thickness of the first casing, the thickness of the second casing, and the clearance between the first casing and the second casing in the reference direction.

(Supplementary Note 11)

The electronic device according to any of supplementary notes 6 to 10, wherein the first casing-side connecting portion is formed by bending the first casing, and the second casing-side connecting portion is formed by bending the second casing.

(Supplementary Note 12)

The electronic device according to any of supplementary notes 6 to 11, wherein the electronic device is a mobile telephone terminal.

The present invention is based upon and claims the benefit of priority from Japanese patent applications No. 2011-205787, filed on Sep. 21, 2011, and No. 2011-205788, filed on Sep. 21, 2011, the disclosures of which are incorporated herein in their entirety by reference.

INDUSTRIAL APPLICABILITY

The present invention is applicable to folding-type electronic devices, for example.

DESCRIPTION OF REFERENCE NUMERALS 90 electronic device
91 first casing
91a first casing-side connecting portion
92 second casing
92a second casing-side connecting portion
93 connecting member 10 electronic device
11 first casing
11a,11b connecting portion
11c flat plate portion
11d first display
11s1 front surface
11s2 rear surface
12 second casing
12a,12b connecting portion
12c flat plate portion
12d second display
12s1 front surface
12s2 rear surface
13a,13b hinge folder
13b1 side wall surface
13b2 side wall surface
21a first display
21b first display control unit
21c first operation input unit
22a second display
22b second display control unit
22c second operation input unit
22d circuit board
22e power supply unit
23a wiring
100 electronic device
101 first casing
101a first casing-side connecting portion
102 second casing
102a second casing-side connecting portion
103 connecting member

The invention claimed is:

1. An electronic device comprising:
a first casing in a flat plate shape having a uniform thickness, the first casing including a front surface and a rear surface parallel to the front surface;
a second casing in a flat plate shape having a uniform thickness, the second casing including a front surface and a rear surface parallel to the front surface; and
a connecting member that connects the first casing and the second casing, the connecting member engaging with the first casing in such a manner as to allow the first casing to turn about a first axis of rotation passing through a first casing-side connecting portion formed at one end of the first casing, and engaging with the second casing in such a manner as to allow the second casing to turn about a second axis of rotation passing through a second casing-side connecting portion formed at one end of the second casing, thereby allowing a turning angle which is an angle formed by the first casing and the second casing to be changeable between 0 degree and 360 degrees, wherein
the electronic device is configured such that in a state where the turning angle is 0 degree or a state where the turning angle is 360 degrees, a distance between the first axis of rotation and the second axis of rotation in a reference direction, which is a direction orthogonal to the front surface of the first casing, equals to a sum calculated by adding a half of a sum of a thickness of the first casing and a thickness of the second casing, and a clearance between the first casing and the second casing in the reference direction, and that the first axis of rotation is arranged at a position shifted from a center of the first casing in the reference direction to a side of the second casing, by a half of a value calculated by subtracting the thickness of the first casing from a thickness of the first casing-side connecting portion in the reference direction.

2. The electronic device according to claim 1, wherein
the first casing and the second casing are configured to turn independently of each other with respect to the connecting member,
each of the first casing and the second casing is configured to be able to turn 180 degrees with respect to the connecting member, and
the electronic device is configured such that when a state is changed from a state where the turning angle is 0 degree to a state where the turning angle is 180 degrees, the first casing turns with respect to the connecting member while the second casing does not turn with respect to the connecting member.

3. The electronic device according to claim 1, wherein
the first casing-side connecting portions are formed at both ends, in a direction along the first axis of rotation, of the first casing, respectively,
the second casing-side connecting portions are formed at both ends, in a direction along the second axis of rotation, of the second casing, respectively,
the electronic device is configured such that in a state where the turning angle is 0 degree, the front surface of the first casing and the front surface of the second casing face each other,
on the front surface of the first casing, a first display for displaying information is disposed to extend to a position between the first casing-side connecting portions, and
on the front surface of the second casing, a second display for displaying information is disposed to extend to a position between the second casing-side connecting portions.

4. The electronic device according to claim 1, wherein
the electronic device is configured such that in a state where the turning angle is 0 degree or a state where the turning angle is 360 degrees, a sum of the thickness of the first casing-side connecting portion in the reference direction and a thickness of the second casing-side connecting portion in the reference direction is smaller than a sum of the thickness of the first casing, the thickness of the second casing, and the clearance between the first casing and the second casing in the reference direction.

5. The electronic device according to claim 1, wherein
the electronic device is a mobile telephone terminal.

6. An electronic device comprising:
a first casing in a flat plate shape having a uniform thickness, the first casing including a front surface and a rear surface parallel to the front surface;
a second casing in a flat plate shape having a uniform thickness, the second casing including a front surface and a rear surface parallel to the front surface; and
a connecting member that connects the first casing and the second casing, the connecting member engaging with the first casing in such a manner as to allow the first casing to turn about a first axis of rotation passing through a first casing-side connecting portion formed at one end of the first casing, and engaging with the second casing in such a manner as to allow the second casing to turn about a second axis of rotation passing through a second casing-side connecting portion formed at one end of the second casing, thereby allowing a turning angle which is an angle formed by the first casing and the second casing to be changeable between 0 degree and 360 degrees, wherein the electronic device is configured such that in a state where the turning angle is 0 degree or a state where the turning angle is 360 degrees, the front surface of the first casing and the front surface of the second casing face each other, and the electronic device is configured such that in a state where the turning angle is 180 degrees, the front surface of the first casing and the front surface of the second casing form a same plane, wherein the electronic device is configured such that in a state where the turning angle is 0 degree or a state where the turning angle is 360 degrees, a distance between the first axis of rotation and the second axis of rotation in a reference direction, which is a direction orthogonal to the front surface of the first casing, equals to a sum calculated by adding a half of a sum of a thickness of the first casing and a thickness of the second casing, and a clearance between the first casing and the second casing in the reference direction, and that the first axis of rotation is arranged at a position shifted from the front surface of the first casing to a side of the second casing, by a half of the clearance.

7. The electronic device according to claim 6, wherein the first casing and the second casing are configured to turn independently of each other with respect to the connecting member, each of the first casing and the second casing is configured to be able to turn 180 degrees with respect to the connecting member, and the electronic device is configured such that when a state is changed from a state where the turning angle is 0 degree to a state where the turning angle is 180 degrees, the first casing turns with respect to the connecting member while the second casing does not turn with respect to the connecting member.

8. An electronic device comprising:

a first casing in a flat plate shape having a uniform thickness, the first casing including a front surface and a rear surface parallel to the front surface;

a second casing in a flat plate shape having a uniform thickness, the second casing including a front surface and a rear surface parallel to the front surface; and a connecting member that connects the first casing and the second casing, the connecting member engaging with the first casing in such a manner as to allow the first casing to turn about a first axis of rotation passing through a first casing-side connecting portion formed at one end of the first casing, and engaging with the second casing in such a manner as to allow the second casing to turn about a second axis of rotation passing through a second casing-side connecting portion formed at one end of the second casing, thereby allowing a turning angle which is an angle formed by the first casing and the second casing to be changeable between 0 degree and 360 degrees, wherein the electronic device is configured such that in a state where the turning angle is 0 degree or a state where the turning angle is 360 degrees, the front surface of the first casing and the front surface of the second casing face each other, and the electronic device is configured such that in a state where the turning angle is 180 degrees, the front surface of the first casing and the front surface of the second casing form a same plane wherein the first casing-side connecting portions are formed at both ends, in a direction along the first axis of rotation, of the first casing, respectively, the second casing-side connecting portions are formed at both ends, in a direction along the second axis of rotation, of the second casing, respectively, on the front surface of the first casing, a first display for displaying information is disposed to extend to a position between the first casing-side connecting portions, and on the front surface of the second casing, a second display for displaying information is disposed to extend to a position between the second casing-side connecting portions.

9. An electronic device comprising:

a first casing in a flat plate shape having a uniform thickness, the first casing including a front surface and a rear surface parallel to the front surface;

a second casing in a flat plate shape having a uniform thickness, the second casing including a front surface and a rear surface parallel to the front surface; and a connecting member that connects the first casing and the second casing, the connecting member engaging with the first casing in such a manner as to allow the first casing to turn about a first axis of rotation passing through a first casing-side connecting portion formed at one end of the first casing, and engaging with the second casing in such a manner as to allow the second casing to turn about a second axis of rotation passing through a second casing-side connecting portion formed at one end of the second casing, thereby allowing a turning angle which is an angle formed by the first casing and the second casing to be changeable between 0 degree and 360 degrees, wherein the electronic device is configured such that in a state where the turning angle is 0 degree or a state where the turning angle is 360 degrees, the front surface of the first casing and the front surface of the second casing face each other, and the electronic device is configured such that in a state where the turning angle is 180 degrees, the front surface of the first casing and the front surface of the second casing form a same plane wherein the electronic device is configured such that in a state where the turning angle is 0 degree or a state where the turning angle is 360 degrees, a sum of the thickness of the first casing-side connecting portion in the reference direction and a thickness of the second casing-side connecting portion in the reference direction is smaller than a sum of the thickness of the first casing, the thickness of the second casing, and the clearance between the first casing and the second casing in the reference direction.

10. The electronic device according to claim 6, wherein the first casing-side connecting portion is formed by bending the first casing, and the second casing-side connecting portion is formed by bending the second casing.

11. The electronic device according to claim 6, wherein the electronic device is a mobile telephone terminal.

* * * * *